United States Patent
Doornbos et al.

(10) Patent No.: US 11,165,032 B2
(45) Date of Patent: Nov. 2, 2021

(54) FIELD EFFECT TRANSISTOR USING CARBON NANOTUBES

(71) Applicant: TAIWAN SEMICONDUCTOR MANUFACTURING CO., LTD., Hsinchu (TW)

(72) Inventors: Gerben Doornbos, Kessel-Lo (BE); Marcus Johannes Henricus Van Dal, Linden (BE); Timothy Vasen, Tervuren (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/562,423

(22) Filed: Sep. 5, 2019

(65) Prior Publication Data
US 2021/0074810 A1   Mar. 11, 2021

(51) Int. Cl.
*H01L 51/05*  (2006.01)
*H01L 27/28*  (2006.01)
(Continued)

(52) U.S. Cl.
CPC ........ *H01L 51/0558* (2013.01); *H01L 27/283* (2013.01); *H01L 51/002* (2013.01); *H01L 51/003* (2013.01); *H01L 51/0012* (2013.01); *H01L 51/0013* (2013.01); *H01L 51/0018* (2013.01); *H01L 51/0048* (2013.01);
(Continued)

(58) Field of Classification Search
CPC .............. H01L 51/0558; H01L 27/283; H01L 51/0048; H01L 51/055; H01L 51/0525; H01L 51/0541
See application file for complete search history.

(56) References Cited

U.S. PATENT DOCUMENTS

2006/0172497 A1  8/2006  Hareland et al.
2019/0035892 A1  1/2019  Tang
(Continued)

FOREIGN PATENT DOCUMENTS

CN  109300789 A    2/2019
DE  112011105995 T5  9/2014
(Continued)

OTHER PUBLICATIONS

M. Shulaker et al. "High-performance carbon nanotube field-effect transistors." In IEEE International Electron Devices Meeting (IEDM) 33-36 (IEEE, 2014).
(Continued)

*Primary Examiner* — Dung A. Le
(74) *Attorney, Agent, or Firm* — McDermott Will & Emery LLP

(57) ABSTRACT

In a method of forming a gate-all-around field effect transistor (GAA FET), a fin structure including carbon nanotubes (CNTs) embedded in a semiconductor layer is formed, a sacrificial gate structure is formed over the fin structure, the semiconductor layer is doped at a source/drain region of the fin structure, an interlayer dielectric (ILD) layer is formed over the doped source/drain region and the sacrificial gate structure, a source/drain opening is formed by patterning the ILD layer, and a source/drain contact layer is formed over the doped source/drain region of the fin structure.

20 Claims, 31 Drawing Sheets

(51) Int. Cl.
 H01L 51/00 (2006.01)
 H01L 51/10 (2006.01)

(52) U.S. Cl.
 CPC .......... *H01L 51/055* (2013.01); *H01L 51/105* (2013.01); *H01L 51/0525* (2013.01); *H01L 51/0529* (2013.01)

(56) References Cited

U.S. PATENT DOCUMENTS

| | | | |
|---|---|---|---|
| 2019/0067441 | A1 | 2/2019 | Yang et al. |
| 2019/0097147 | A1 | 3/2019 | Lu et al. |
| 2020/0075875 | A1* | 3/2020 | Vasen ................ H01L 51/0525 |
| 2020/0161574 | A1* | 5/2020 | Vasen ................ H01L 51/0021 |
| 2020/0357911 | A1* | 11/2020 | Frougier ............ H01L 29/165 |

FOREIGN PATENT DOCUMENTS

| | | |
|---|---|---|
| DE | 102017114953 A1 | 12/2018 |
| DE | 112017007991 T5 | 6/2020 |
| KR | 10-2016-0101213 A | 8/2016 |
| KR | 10-2019-0024535 A | 3/2019 |
| TW | 201347046 A | 11/2013 |
| TW | 201820634 A | 6/2018 |
| TW | 201901960 A | 1/2019 |
| TW | 201905989 A | 2/2019 |
| TW | 201931601 A | 8/2019 |
| WO | 2013/095651 A1 | 6/2013 |

OTHER PUBLICATIONS

G. Hills et al., "Understanding Energy Efficiency Benefits of Carbon Nanotube Field-Effect Transistors for Digital VLSI," IEEE Trans. Nanotechnology, 2018.

A. Franklin et al., "Carbon Nanotube Complementary Wrap-Gate Transistors," NANO Letters, 13, pp. 2490-2495 (2013).

J. Tang et al., "Carbon Nanotube Complementary Logic with Low-Temperature Processed End-Bonded Metal Contacts." In IEEE International Electron Devices Meeting (IEDM) 111-114 (IEEE, 2016).

* cited by examiner

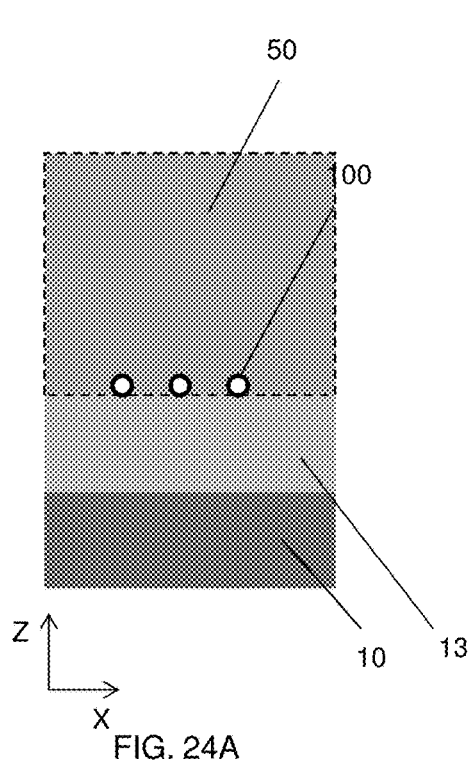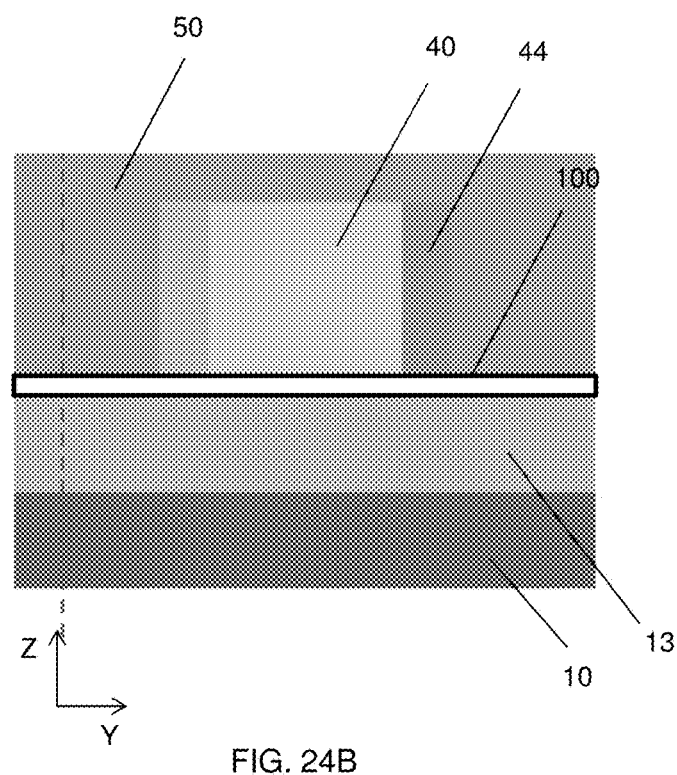
FIG. 24A
FIG. 24B

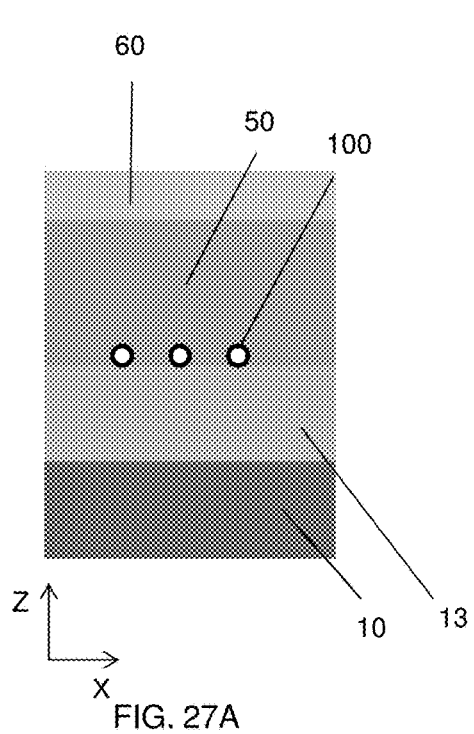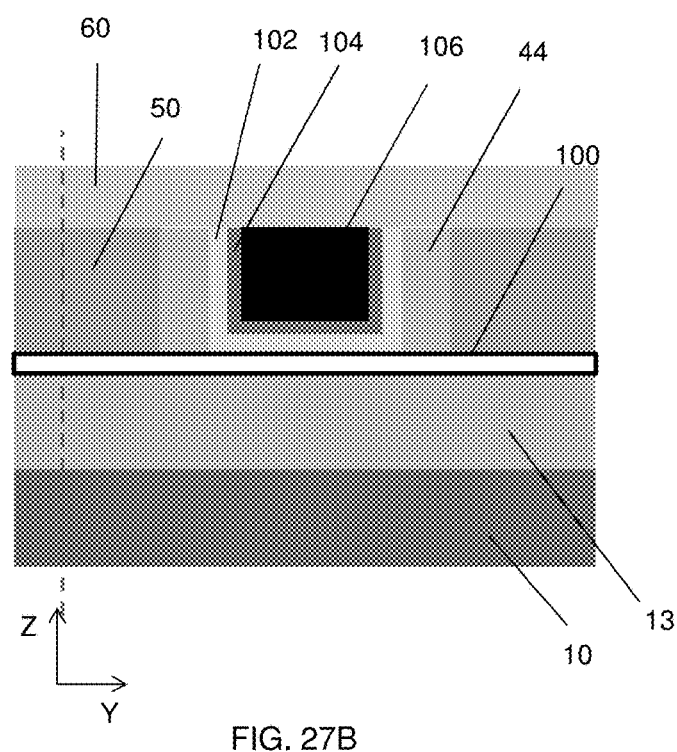
FIG. 27A
FIG. 27B

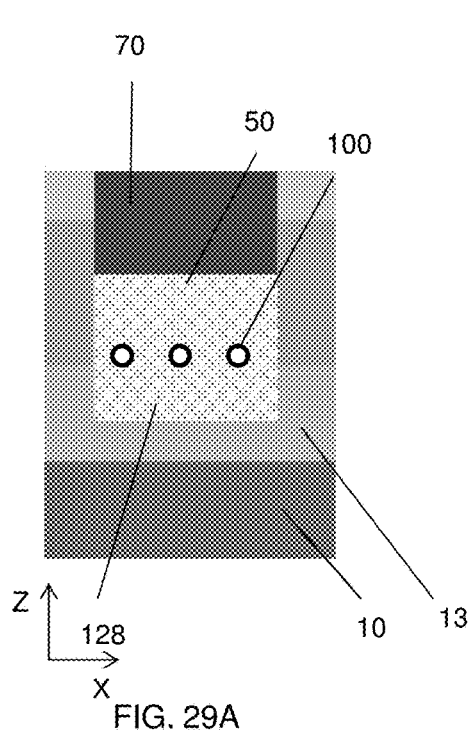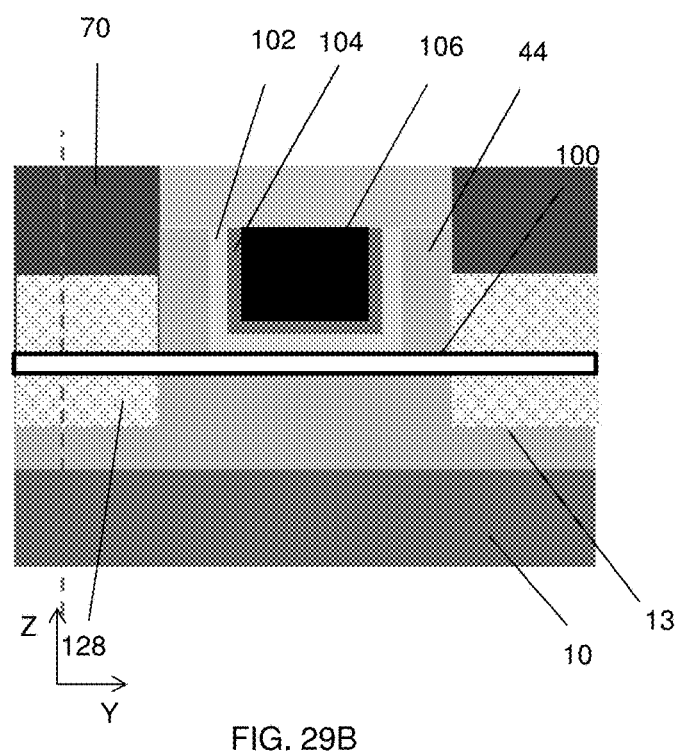
FIG. 29A
FIG. 29B

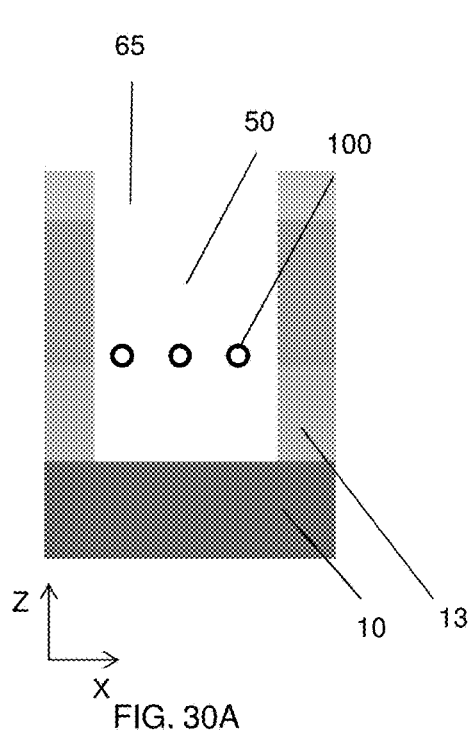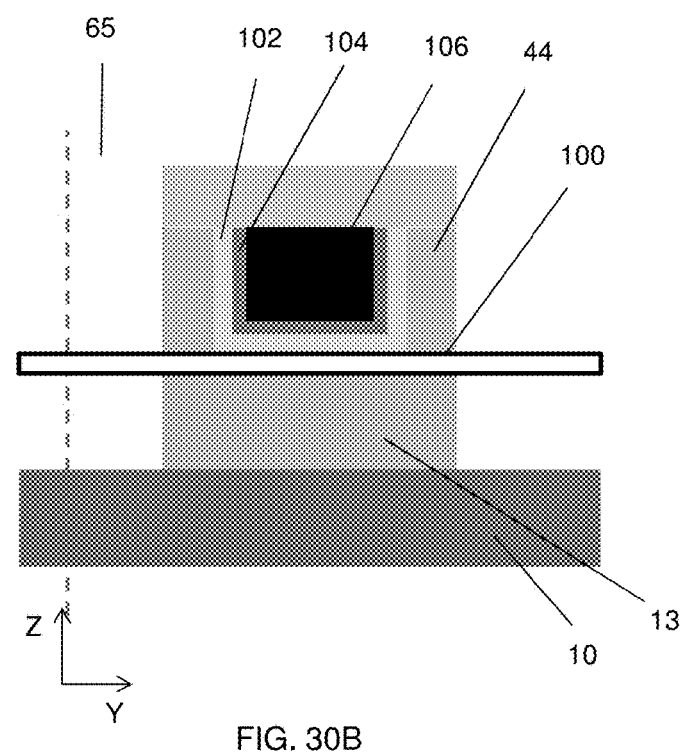
FIG. 30A
FIG. 30B

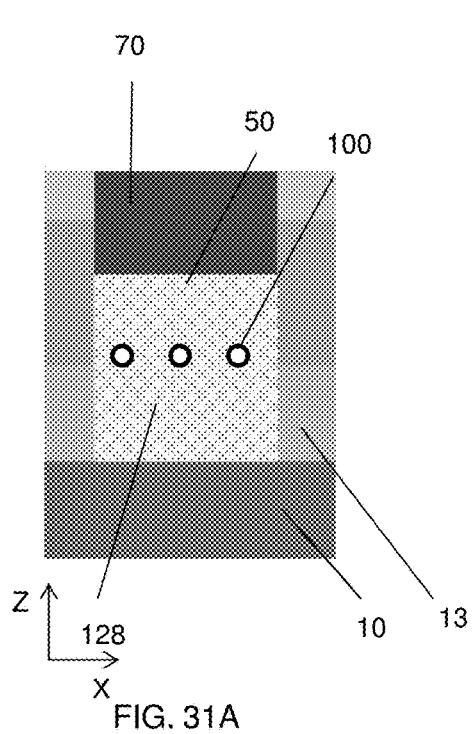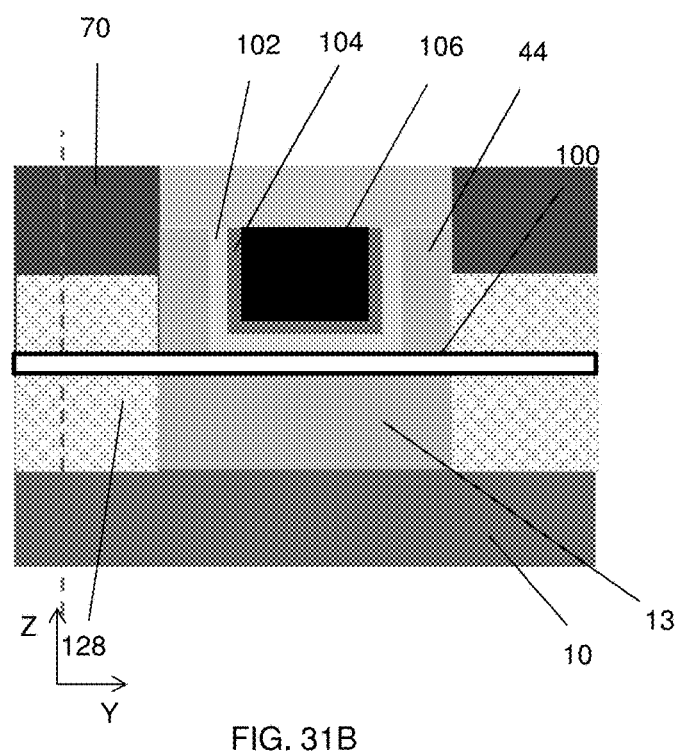
FIG. 31A
FIG. 31B

FIELD EFFECT TRANSISTOR USING CARBON NANOTUBES

BACKGROUND

As the semiconductor industry has progressed into nanometer technology process nodes in pursuit of higher device density, higher performance, and lower costs, challenges from both fabrication and design issues have resulted in the development of three-dimensional designs, such as gate all around (GAA) structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 24A and 24B illustrate one of the various stages of a sequential fabrication process of an FET using a CNT in accordance with an embodiment of the present disclosure.

FIGS. 27A and 27B illustrate one of the various stages of a sequential fabrication process of an FET using a CNT in accordance with an embodiment of the present disclosure.

FIGS. 29A and 29B illustrate one of the various stages of a sequential fabrication process of an FET using a CNT in accordance with an embodiment of the present disclosure.

FIGS. 30A and 30B illustrate one of the various stages of a sequential fabrication process of an FET using a CNT in accordance with an embodiment of the present disclosure.

FIGS. 31A and 31B illustrate one of the various stages of a sequential fabrication process of an FET using a CNT in accordance with an embodiment of the present disclosure.

DETAILED DESCRIPTION

Figure 1A:
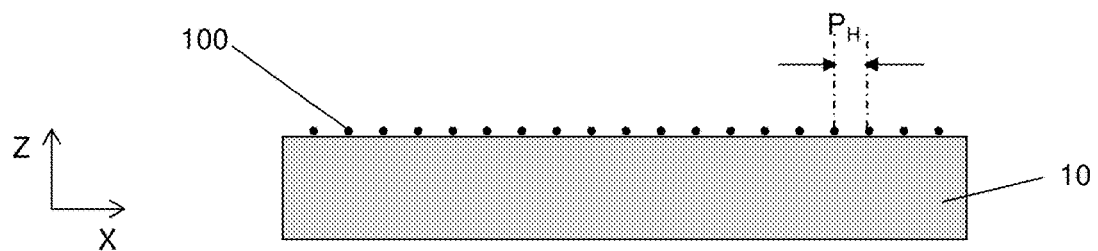
FIGS. 1A, 1B and 1C show various stages of a sequential fabrication process of a GAA FET using a CNT in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Carbon nanotubes (CNTs) having diameters in the order of nm (e.g., about 1 nm) are considered a material of choice for making scaled FET device due to their cylindrical geometry, excellent electrical and mechanical properties. A field effect transistor (FET) using a CNT with a gate length about 10 nm or less shows excellent electrical characteristics. However, a fabrication technology compatible with a CMOS fabrication technology has not been established. In the present disclosure, by stacking layers of aligned CNTs on a substrate and forming a fin structure from the stacked CNTs, a horizontal gate all around process flow compatible with a CMOS technology is provided.

In some embodiments, semiconductor devices include a novel structure of field-effect transistors including stacked, gate-all-around (GAA) carbon nanotubes (CNTs). The semiconductor devices include an array of aligned CNTs with a gate dielectric layer wrapping therearound and a gate electrode layer. The GAA FETs with CNTs can be applied to logic circuits in advanced technology node. However, control of the doping profile in CNTs is often challenging. Generally, it is desirable to have an undoped channel region of the GAA FET, while having doped source/drain extension and source/drain contact regions.

In the present disclosure, the source/drain region of CNTs is doped from a doped bulk semiconductor material to provide more carriers in the CNTs and to reduce contact resistance.

FIGS. 1A-21 illustrate various stages of a sequential fabrication process of a GAA FET using carbon nanotubes in accordance with embodiments of the present disclosure. It is understood that additional operations can be provided before, during, and after processes shown by FIGS. 1A-21, and some of the operations described below can be replaced or eliminated, for additional embodiments of the method. The order of the operations/processes may be interchangeable.

As shown in FIG. 1A, one or more carbon nanotubes (CNTs) 100 are arranged over a substrate 10. The CNTs are arranged on the substrate aligned with substantially the same direction (e.g., Y direction). The deviation from the Y direction of the alignment of the CNTs 100 is about ±10 degrees in some embodiments, and is about ±5 degrees in other embodiments. In certain embodiments, the deviation is about ±2 degrees. The CNTs 100 are arranged with a density in a range from about 50 tubes/µm to about 300 tubes/µm along the X direction in some embodiments, and in other embodiments, the density is in a range from about 100 tubes/µm to about 200 tubes/µm along the X direction. The length of the CNTs 100 (in the Y direction) is in a range from about 0.5 µm to about 5 µm in some embodiments, and is in a range from about 1 µm to about 2 µm in other embodiments. The average diameter of the CNTs 100 is in a range from about 1.0 nm to about 2.0 nm in some embodiments.

In some embodiments, the substrate 10 is made of a suitable elemental crystalline semiconductor, such as silicon, diamond or germanium; a suitable alloy or compound crystalline semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, crystalline silicon is used as the substrate 10.

In some embodiments, a bottom support layer is formed on the substrate 10 and the CNTs 100 are disposed on the bottom support layer. In some embodiments, the bottom support layer includes one or more layers of sapphire, silicon oxide, silicon nitride, SiON, SiOC, SiOCN and SiCN, or other suitable insulating material. In other embodiments, the bottom support layer includes a polycrystalline or amorphous material of one of Si, Ge and SiGe. The bottom support layer can be formed by suitable film formation methods, such as thermal oxidation, chemical vapor deposition (CVD), physical vapor deposition (PVD) or atomic layer deposition (ALD).

Carbon nanotubes can be formed by various methods, such as arc-discharge or laser ablation methods, or a templated CVD method on a sapphire substrate. The formed CNTs can be dispersed in a solvent, such as sodium dodecyl sulfate (SDS). The CNTs can be transferred to and disposed on a substrate using various methods, such as a floating evaporative self-assembly method in some embodiments.

Figure 2A:
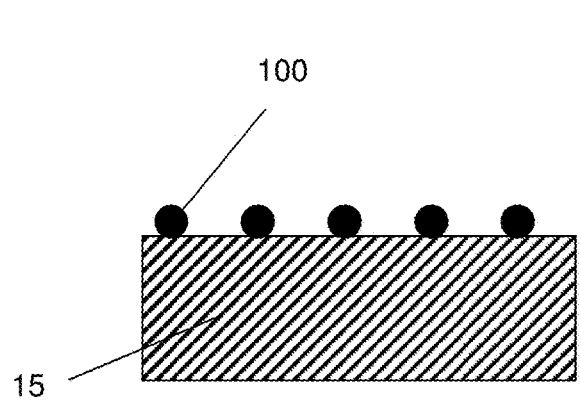
FIGS. 2A, 2B, 2C, 2D and 2E show various stages of a sequential fabrication process of a GAA FET using a CNT in accordance with an embodiment of the present disclosure.
Figure 2B:
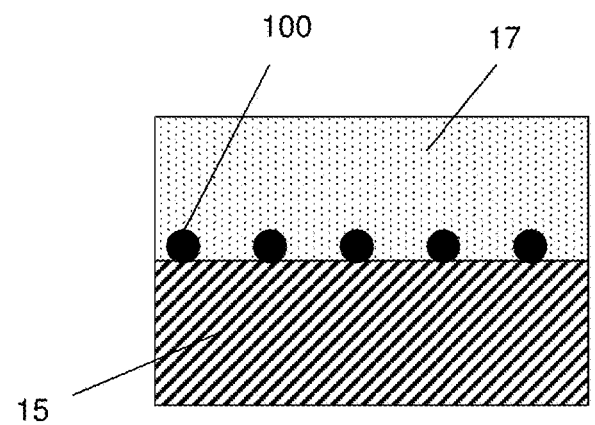
Figure 2C:
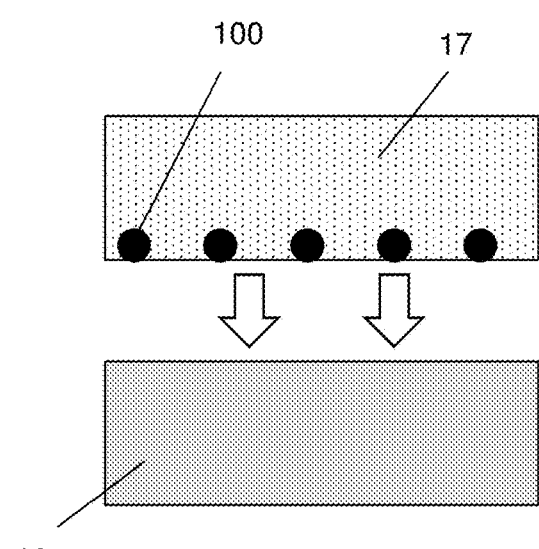
Figure 2D:
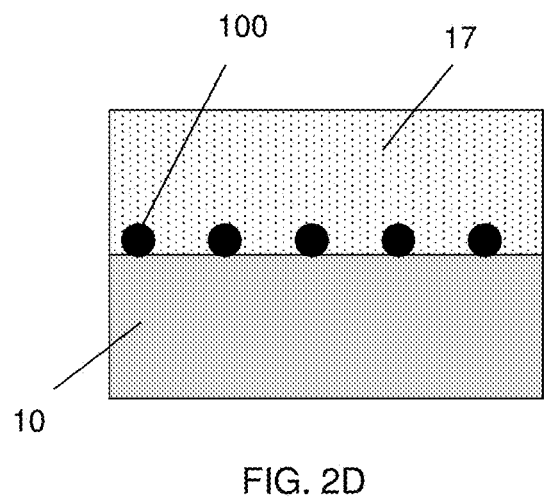
Figure 2E:
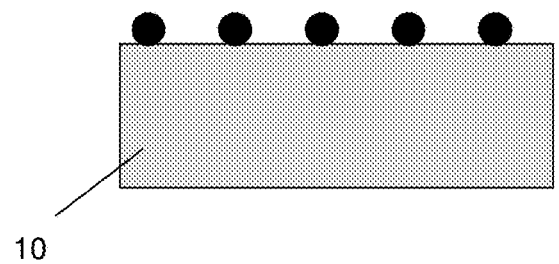

FIGS. 2A-2E show operations to transfer the CNTs to the substrate 10. In some embodiments, CNTs 100 are disposed on a dummy substrate 15 as set forth above and as shown in FIG. 2A. In some embodiments, the dummy substrate 15 is a sapphire substrate. The CNTs 100 are arranged with a pitch in a range from about 5 nm to about 15 nm in some embodiments. Then, a transfer film 17 is formed over the CNTs 100 and the dummy substrate 15 as shown in FIG. 2B. In some embodiments, the transfer film is a metal film, such as a gold film. The transfer film 17 is detached from the dummy substrate 15 together with the CNTs 100, as shown in FIG. 2C. Then, the transfer film 17 with the CNTs 100 are attached on the substrate 10 as shown in FIG. 2D. The transfer film 17 is then detached from the substrate 10, thereby leaving the CNTs 100 on the substrate 10, as shown in FIG. 2E.

Figure 2F:
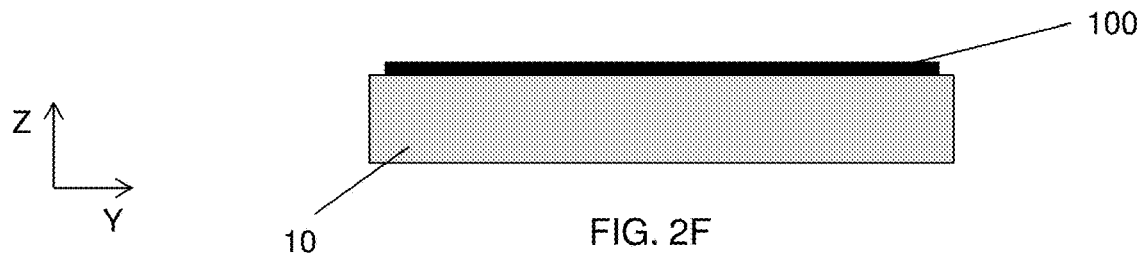
FIGS. 2F, 2G, 2H, 2I and 2J show various stages of a sequential fabrication process of a GAA FET using a CNT in accordance with an embodiment of the present disclosure.
Figure 2G:
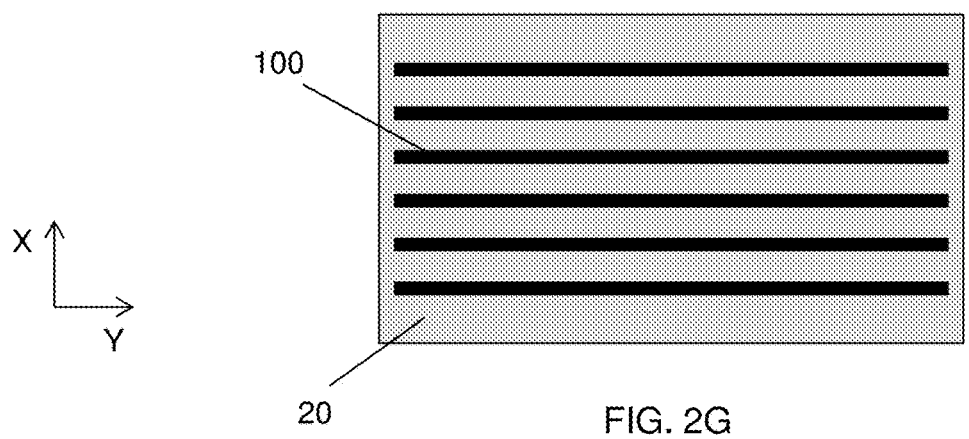
Figure 2H:
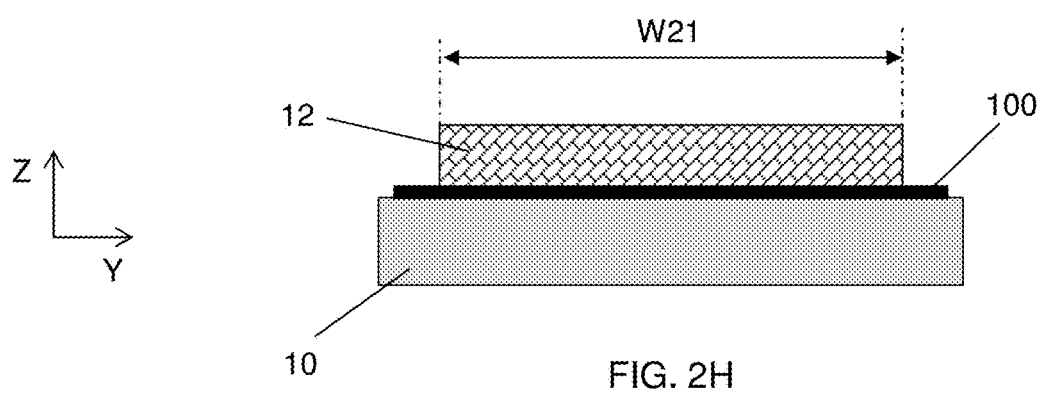
Figure 2I:
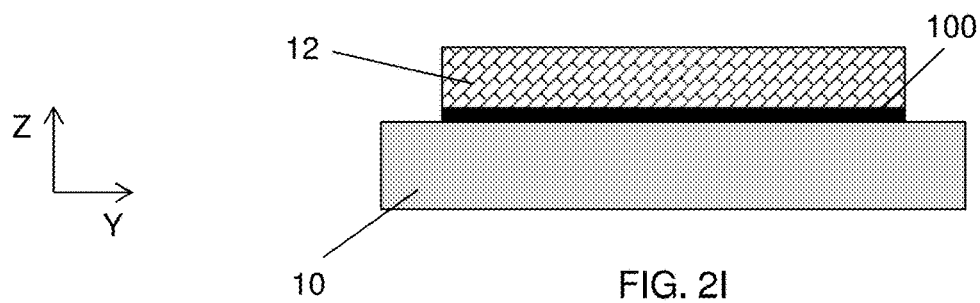
Figure 2J:
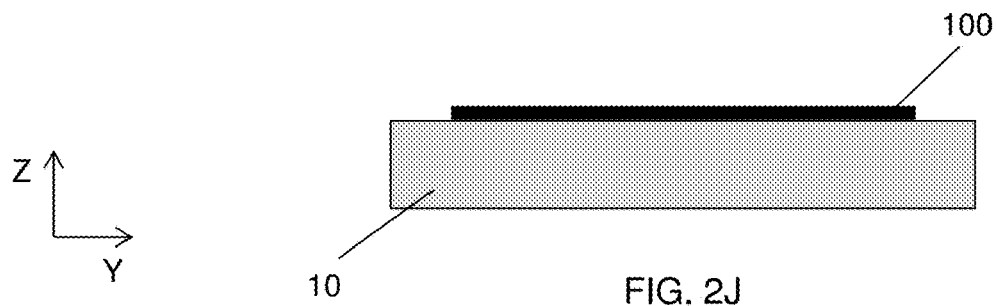

In some embodiments, after the CNTs 100 are transferred over the substrate 10, a trimming process as shown in FIGS. 2F-2J is performed. After the CNTs 100 are transferred onto the substrate 10 as shown in FIG. 2F (a cross sectional view) and 2G (a top/plan view), a photo resist pattern 12, as a cover layer, is formed over a center part of the CNTs 100 by using a lithography operation. End portions of the CNTs 100 are exposed, as shown in FIG. 2H. The width W21 of the photo resist pattern 12 is in a range from about 50 nm to about 2000 nm in some embodiments, and is in a range from about 100 nm to about 1000 nm in other embodiments. Then, the exposed end portions of the CNTs 100 are removed by etching, as shown in FIG. 2I. Further, as shown in FIG. 2J, the resist pattern 12 is then removed by dry etching and/or wet removal using an organic solvent. In some embodiments, the trimming process is performed on the dummy substrate 15 before transferring the CNTs 100 to the substrate 10.

Figure 1B:
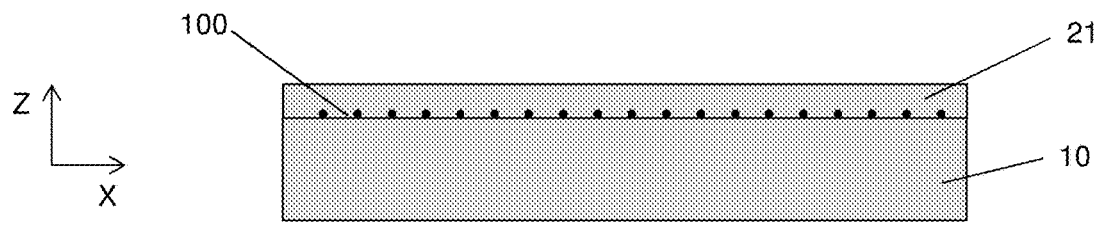

After the CNTs 100 are transferred onto the substrate 10, a first support layer 21 is formed over the CNTs 100 (a first group of CNTs) disposed on the substrate 10, as shown in FIG. 1B. In some embodiments, the first support layer 21 is made of the same semiconductor material as the substrate 10 and is epitaxially formed on the substrate 10. In some embodiments, the first support layer 21 is made of a different semiconductor material than the substrate 10. In certain embodiments, SiGe is epitaxially formed on the substrate 10. In other embodiments, a polycrystalline or amorphous material of one of Si, Ge and SiGe is formed over the CNTs 100. In certain embodiments, an annealing operation, such as laser annealing, is performed to crystalize the polycrystalline or amorphous material layer.

In some embodiments, when the first support layer is conformally formed over the first group of CNTs 100, the upper surface of the first support layer has a wavy shape having peaks and valleys. The thickness of the first support layer 21 is in a range from about 2 nm to about 20 nm in some embodiments, and is in a range from about 5 nm to 15 nm in other embodiments. In other embodiments, after the first support layer 21 is formed with the wavy upper surface, one or more planarization operations are performed to flatten the upper surface of the support layer 21. The planarization operation includes an etch-back process or a chemical mechanical polishing (CMP) process. In one embodiment, CMP is used.

Figure 1C:
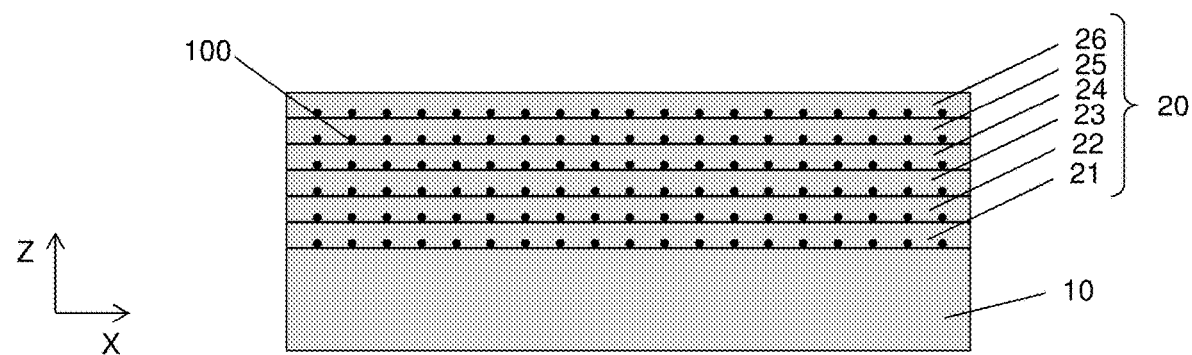

Further, a second group of CNTs 100 are disposed on the first support layer 21 as shown in FIG. 1C. Then, a second support layer 22 is formed over the first support layer 21 and the second group of CNTs 100 as shown in FIG. 1C. In some embodiments, the second support layer 22 is made of the same material as the first support layer 21. In some embodiments, silicon is epitaxially formed over the first support layer 22. The thickness of the second support layer 22 is substantially the same as the thickness of the first support layer 21. The difference in the thickness is within ±5% in some embodiments with respect to the average thickness.

Further, a third-sixth group of CNTs 100 are disposed on the second support layer 22 as shown in FIG. 1C.

In some embodiments, forming a group of CNTs and forming a support layer are repeated to form n support layers in each of which CNTs are embedded, where n is integer of two or more, for example 10. In some embodiments, n is up to 20. FIG. 1C shows one embodiment, in which six support layers 21, 22, 23, 24, 25 and 26 are formed, thus forming six layers of CNTs disposed in a support layer 20. In the following explanation, the first to sixth support layers 21-26 are referred to as a support layer 20.

In FIG. 1C, the CNTs 100 in one layer are arranged in a substantially constant pitch and the CNTs in the vertical direction are aligned. However, the arrangement of the CNTs in the support layer 20 is not limited to those of FIG. 1C. In some embodiments, the CNTs in one layer have a random pitch in the X direction. When the average diameter of the CNTs 100 is $D_{CNT}$, horizontal pitch $P_H$ of the CNTs is $D_{CNT} \leq P_H \leq 10 \times D_{CNT}$, in some embodiments. In some embodiments, two adjacent CNTs are in contact with each other. Further, in the vertical direction, at least two CNTs 100 in different layers are not aligned with each other, in some embodiments. The vertical pitch $P_V$ of the CNTs 100 is determined by the thickness of the support layers. In some embodiments, a vertical pitch $P_V$ of the CNTs 100 in adjacent layers is $0.9 \times P_A \leq P_V \leq 1.1 \times P_A$, where $P_A$ is an average pitch of the multiple layers. In other embodiments, the vertical pitch $P_V$ is $0.95 \times P_A \leq P_V \leq 1.05 \times P_A$.

As set forth above, the CNTs 100 are embedded in a crystalline semiconductor layer 20 over the substrate 10. In some embodiments, each of the support layers 20 is undoped. In other embodiments, each of the support layers 20 is doped.

Figure 3:
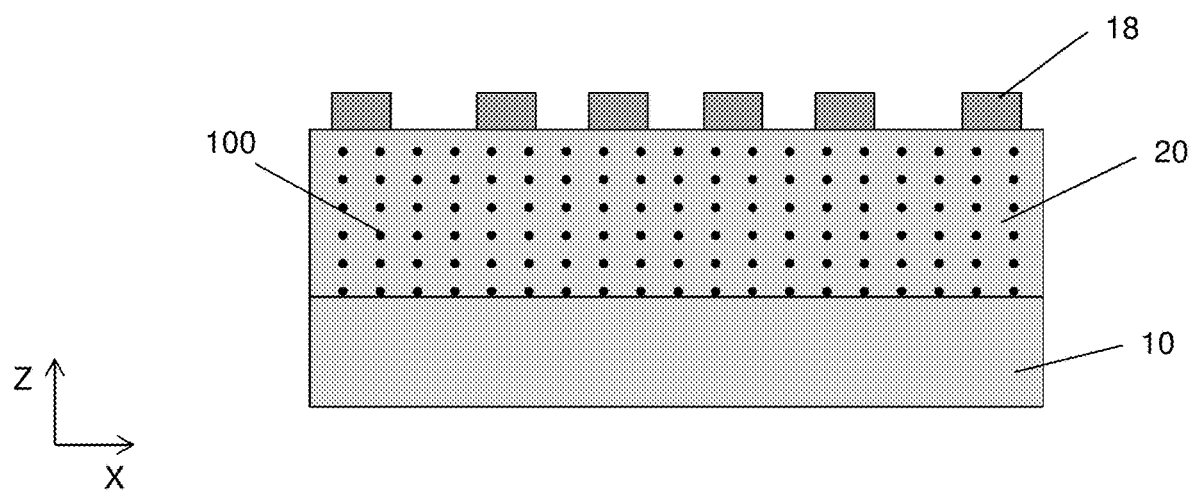
FIG. 3 shows one of the various stages of a sequential fabrication process of a GAA FET using a CNT in accordance with an embodiment of the present disclosure.
Figure 4:
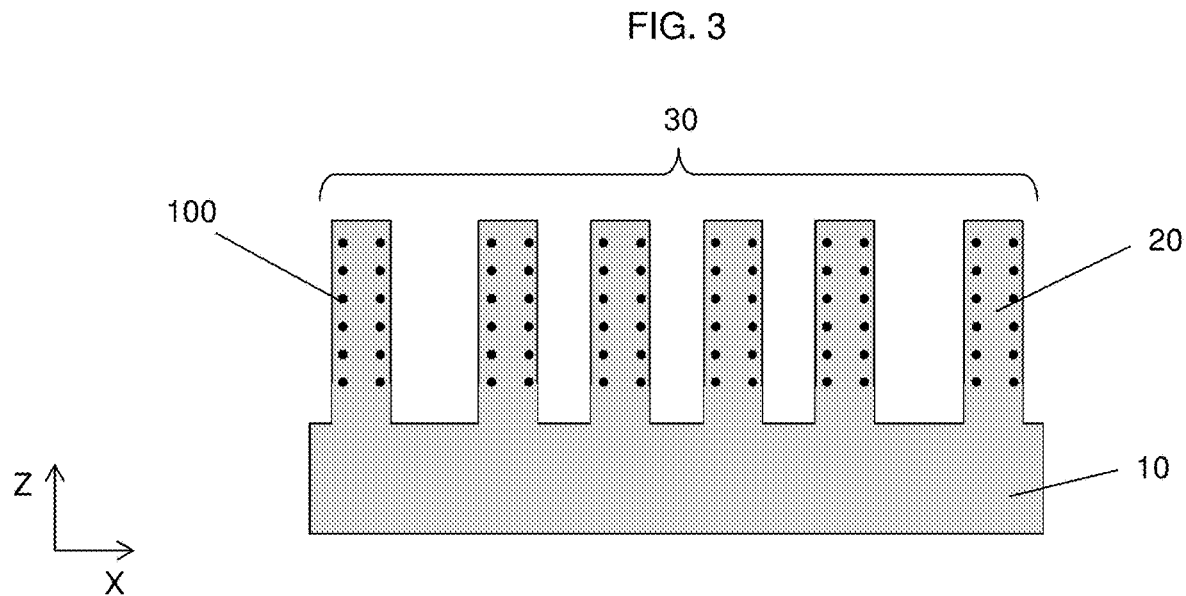
FIG. 4 shows one of the various stages of a sequential fabrication process of a GAA FET using a CNT in accordance with an embodiment of the present disclosure.

Adverting to FIG. 3, by using one or more lithography and etching operations, a mask pattern 18 is formed over the support layer 20, and the support layer 20 with the CNTs 100 is patterned into one or more fin structures 30 as shown in FIG. 4. The mask pattern 18 is a photo resist layer in some embodiments, and is a hard mask made of dielectric material in other embodiments. In some embodiments, the fin structures 30 are patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

In some embodiments, the width of the fin structures 30 in the X direction is in a range from about 5 nm to about 20 nm, and is in a range from about 7 nm to about 12 nm in other embodiments. When the substrate 10 is made of the same or similar material as the support layers 20, the substrate 10 is also patterned into fin structure as shown in FIG. 4. In other embodiments, when the substrate 10 is made of a different material than the support layers 20, the substrate 10 is not patterned.

The total number of the CNTs 100 per fin structure is in a range from about 5 to about 100 in some embodiments, and is in a range from about 10 about 50 in other embodiments.

Figure 5:
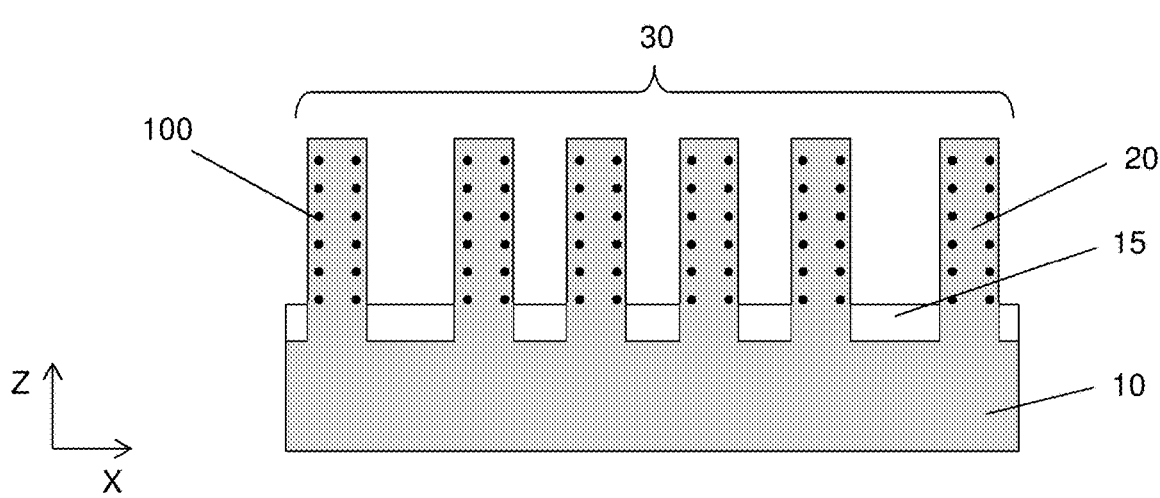
FIG. 5 shows one of the various stages of a sequential fabrication process of a GAA FET using a CNT in accordance with an embodiment of the present disclosure.

Next, as shown in FIG. 5, an isolation insulating layer 15 is formed. The insulating material for the isolation insulating layer 15 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. In some embodiments, the flowable film is cured and annealed more than once. The flowable film may be doped with boron and/or phosphorous. The insulating layer is first formed in a thick layer so that the fin structures 30 are embedded in the thick layer, and the thick layer is recessed so as to expose the upper portions of the fin structures 30, as shown in FIG. 5. The insulating layer can be recessed by using dry and/or wet etching. After or before recessing the isolation insulating layer, a thermal process, for example, an anneal process, may be performed to improve the quality of the isolation insulating layer. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

In some embodiments, the bottommost CNT is located above the upper surface of the isolation insulating layer 15. In other embodiments, the bottommost CNT is located equal to or below the upper surface of the isolation insulating layer 15.

Figure 6A:
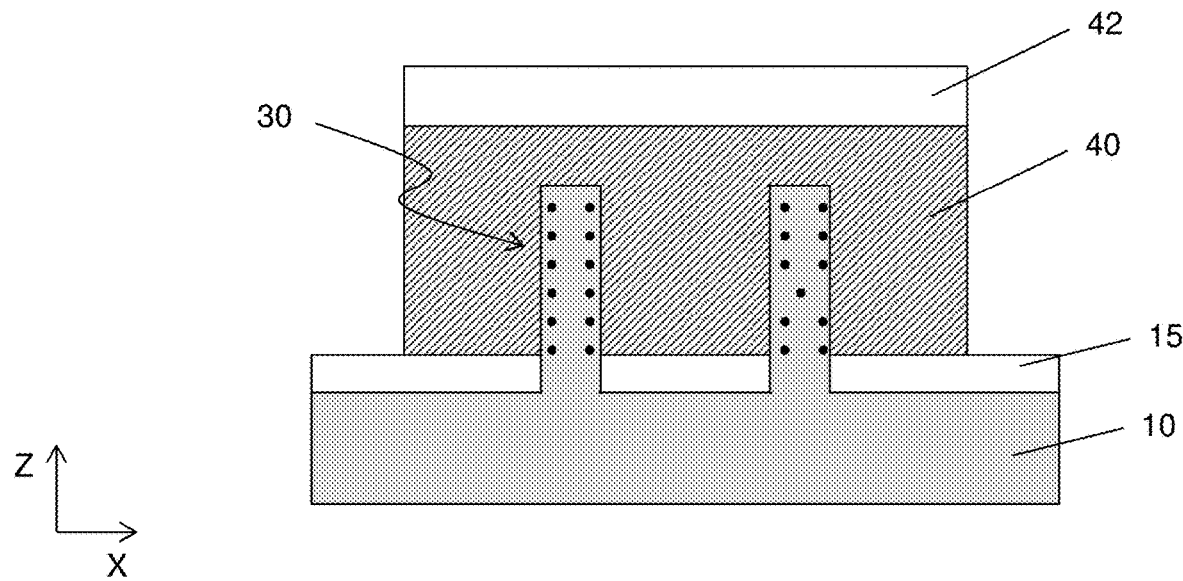
FIGS. 6A and 6B illustrate one of the various stages of a sequential fabrication process of a GAA FET using a CNT in accordance with an embodiment of the present disclosure.
Figure 6B:
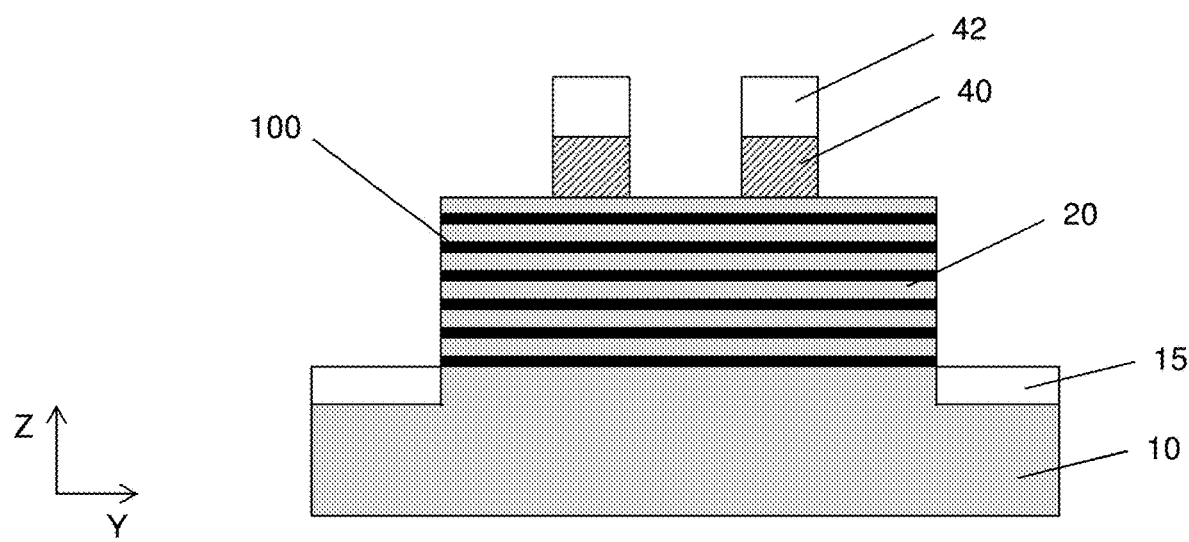

Subsequently, a sacrificial gate structure 40 is formed over the fin structures 30 as shown in FIGS. 6A and 6B. FIG. 6A is a cross sectional view along the X direction and the FIG. 6B is a cross sectional view along the Y direction. The sacrificial gate structure 40 is formed by blanket depositing a sacrificial gate electrode layer over the fin structures 30 such that the fin structures 30 are fully embedded in the sacrificial gate electrode layer. The sacrificial gate electrode layer includes polycrystalline or amorphous silicon, germanium or silicon germanium. The thickness of the sacrificial gate electrode layer is in a range from about 100 nm to about 200 nm in some embodiments. In some embodiments, the sacrificial gate electrode layer is subjected to a planarization operation. The sacrificial gate electrode layer is deposited using CVD, including LPCVD and PECVD, PVD, ALD, or other suitable process. In some embodiments, no sacrificial gate dielectric layer is formed between the fin structure 30 and the sacrificial gate electrode layer, and in other embodiments, a sacrificial gate dielectric layer is formed between the fin structure 30 and the sacrificial gate electrode layer. In some embodiments the sacrificial gate dielectric layer is silicon dioxide with a thickness between about 1 nm and about 2 nm.

Subsequently, a hard mask layer 42 is formed over the sacrificial gate electrode layer 40. The mask layer 42 includes one or more of a silicon nitride (SiN) layer and a silicon oxide layer, or any other material suitable for hard mask. Next, a patterning operation is performed on the hard mask layer and the sacrificial gate electrode layer is patterned into the sacrificial gate structure 40, as shown in FIGS. 6A and 6B. By patterning the sacrificial gate structure, the fin structures 30 are partially exposed on opposite sides of the sacrificial gate structure 40, thereby defining source/drain (S/D) regions, as shown in FIG. 6B. In this disclosure, a source and a drain are interchangeably used and the structures thereof are substantially the same. In FIGS. 6A and 6B, two sacrificial gate structures 40 are formed over two fin structures 30, but the number of the sacrificial gate structures is not limited to this configuration. One or more than two sacrificial gate structures can be arranged in the Y direction in some embodiments. In certain embodiments, one or more dummy sacrificial gate structures are formed on both sides of the sacrificial gate structures to improve pattern fidelity.

Figure 7A:
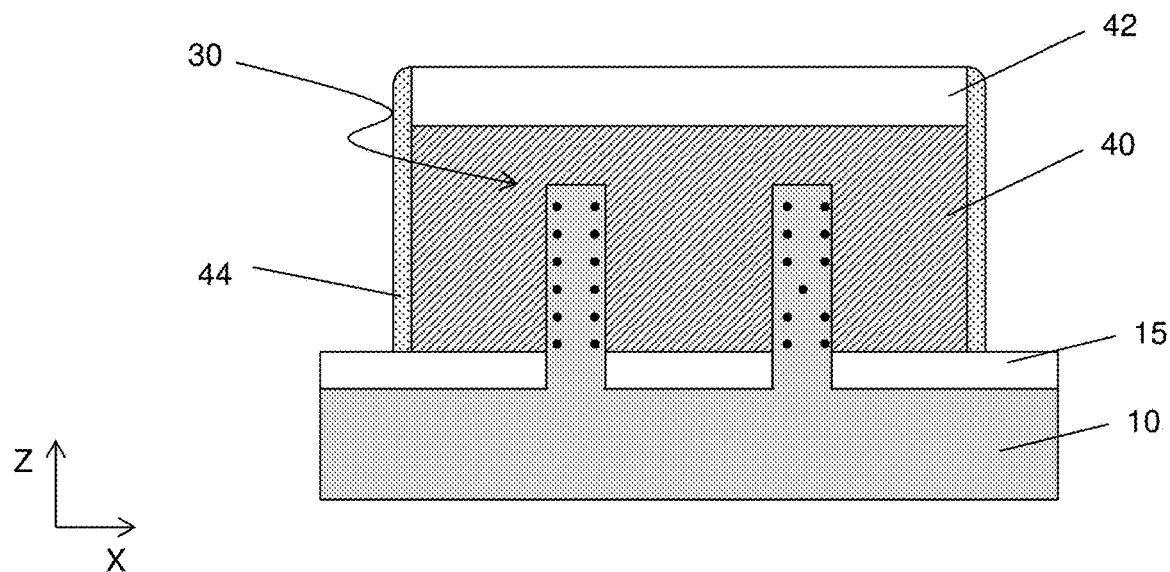
FIGS. 7A and 7B illustrate one of the various stages of a sequential fabrication process of a GAA FET using a CNT in accordance with an embodiment of the present disclosure.
Figure 7B:
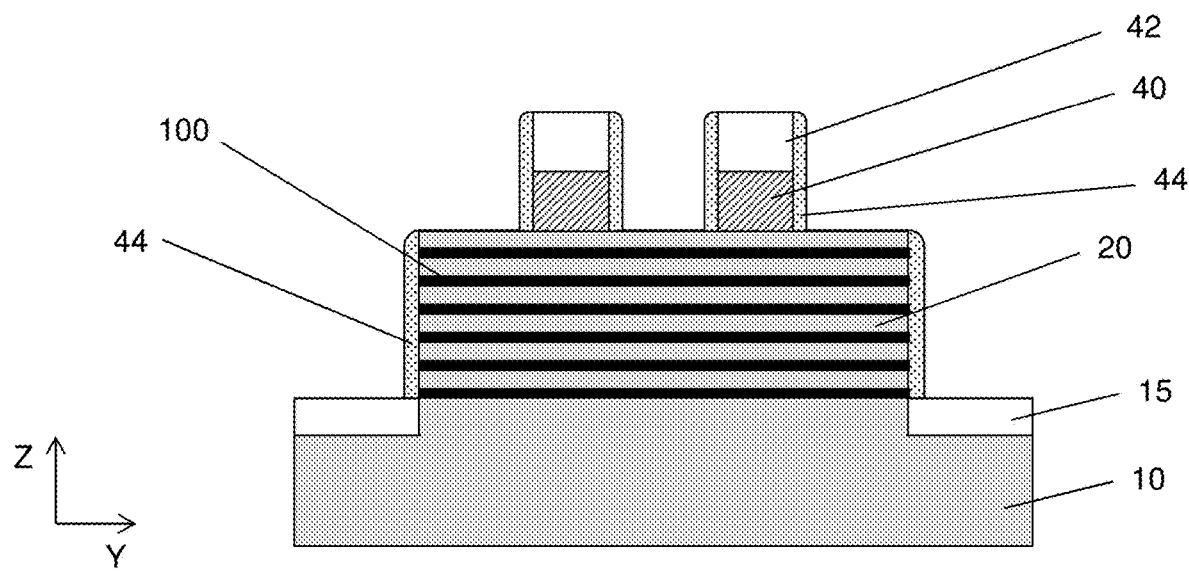

After the sacrificial gate structure 40 is formed, a blanket layer of an insulating material for gate sidewall spacers 44 is conformally formed by using CVD or other suitable methods, as shown in FIGS. 7A and 7B. The blanket layer is deposited in a conformal manner so that it is formed to have substantially equal thicknesses on vertical surfaces, such as the sidewalls, horizontal surfaces, and the top of the sacrificial gate structures 40. In some embodiments, the blanket layer is deposited to a thickness in a range from about 2 nm to about 10 nm. In some embodiments, the insulating material of the blanket layer is a silicon nitride-based material, such as SiN, SiON, SiOCN or SiCN and combinations thereof. In certain embodiments, the insulating material is one of SiOC, SiCON and SiCN. As understood from FIGS. 7A and 7B, in some embodiments, the CNTs 100 are supported by the support layer 20 but are not supported (anchored) by the sidewall spacers 44. In some embodiments, before the blanket layer for the sidewall spacers 44 is formed, the support layer 20 is slightly etched to expose the ends of the CNTs 100. In such a case, the ends of the CNTs 100 are supported (anchored) by the sidewall spacers 44, and thus ends of the CNTs 100 are covered by an insulating material.

Further, as shown in FIGS. 7A and 7B, the gate sidewall spacers 44 are formed on opposite sidewalls of the sacrificial gate structures 40 by anisotropic etching. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces, such as the sidewalls of the sacrificial gate structures and the sidewalls of the exposed fin structures. The mask layer 42 may be exposed from the sidewall spacers 44. In some embodiments, an isotropic etching process may be subsequently performed to remove the insulating material from the upper and/or side portions of the S/D region of the exposed fin structures 30.

Figure 8A:
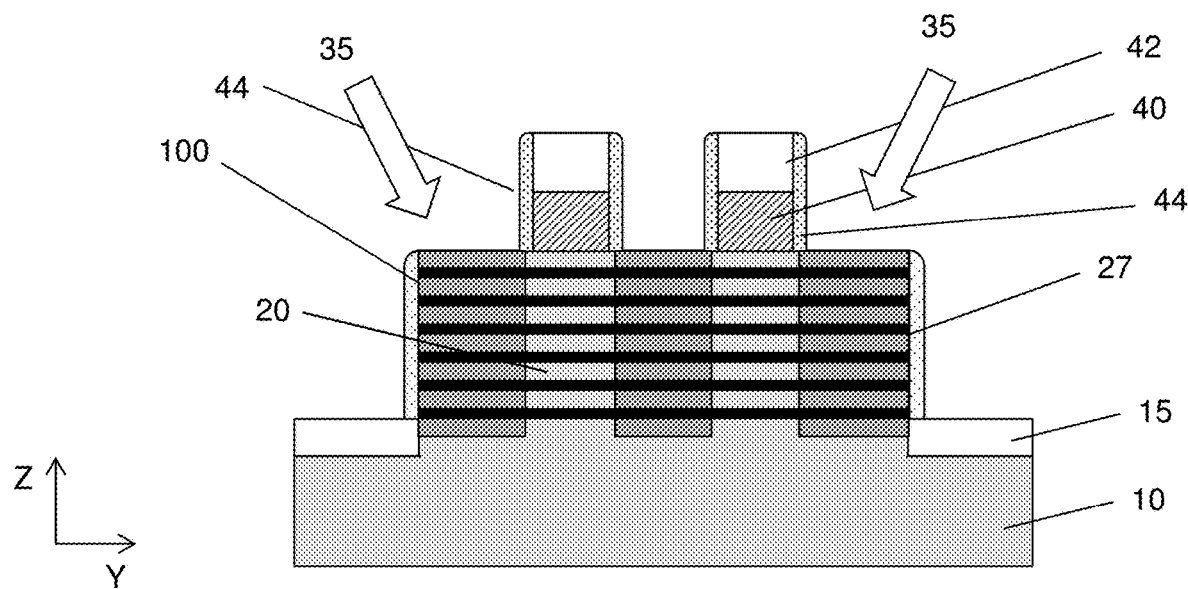
FIG. 8A illustrates one of the various stages of a sequential fabrication process of a GAA FET using a CNT in accordance with an embodiment of the present disclosure.

In some embodiments, the source/drain region of the fin structures 30 are ion-implanted to dope impurities in the source/drain regions, to form a doped region 27 as shown in FIG. 8A. In some embodiments, P and/or As are implanted for an n-type FET and B ($BF_2$) and/or Ga are implanted for a p-type FET. In some embodiments, a dose amount is controlled such that an impurity concentration in the silicon layer of the source/drains is in a range from about $1\times10^{20}$ atoms/cm$^3$ to about $1\times10^{21}$ atoms/cm$^3$. The impurity concentration in the silicon layer of the source/drains is in a range from about $2\times10^{20}$ atoms/cm$^3$ to about $5\times10^{20}$ atoms/cm$^3$ in other embodiments.

Figure 8B:
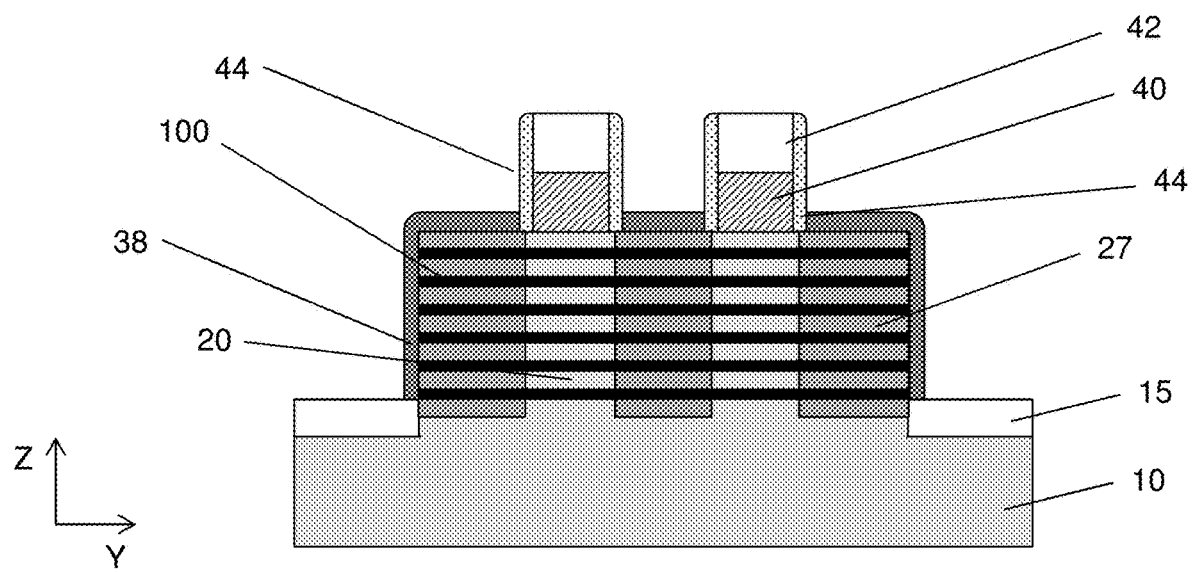
FIG. 8B illustrates one of the various stages of a sequential fabrication process of a GAA FET using a CNT in accordance with another embodiment of the present disclosure.

In other embodiments, a doping layer 38 containing impurities is formed over the source/drain regions of the fin structure 30 as shown in FIG. 8B. The doping layer 38 includes Si, SiGe or Ge containing P and/or As for an n-type FET and B and/or Ga for a p-type FET by in-situ doping. After the doping layer 38 is formed, a thermal annealing operation is performed to drive the impurities into the source/drain regions. In some embodiments, the doping layer 38 is removed after the driving-in annealing, and in other embodiments, the doping layer 38 remains.

Figure 9A:
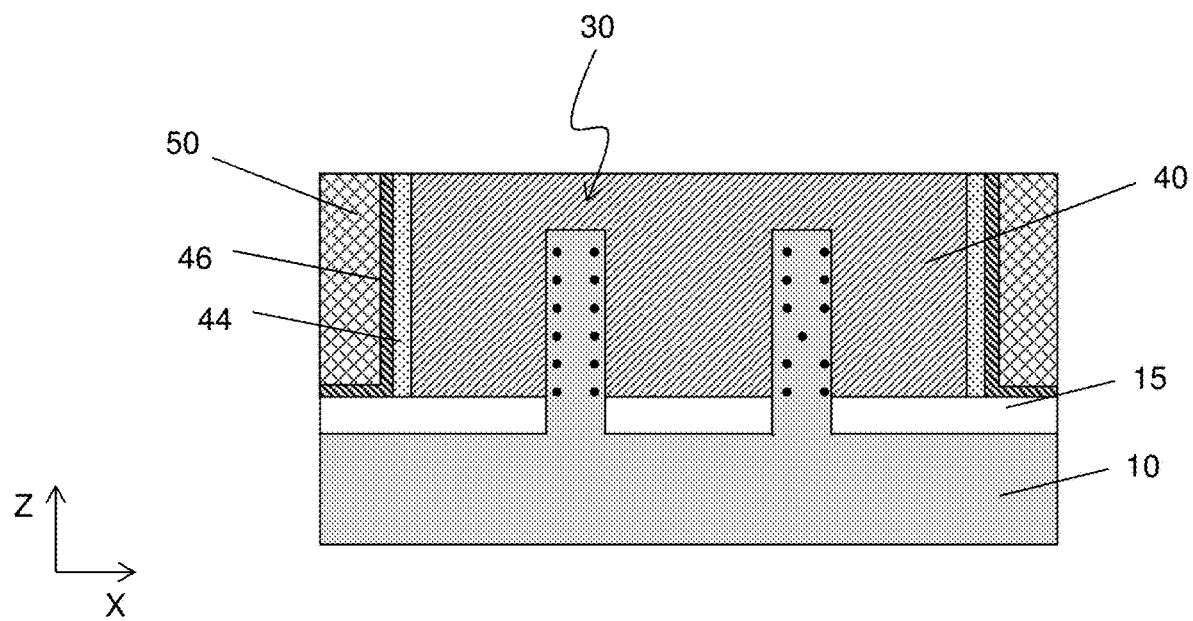
FIGS. 9A and 9B illustrate one of the various stages of a sequential fabrication process of a GAA FET using a CNT in accordance with an embodiment of the present disclosure.
Figure 9B:
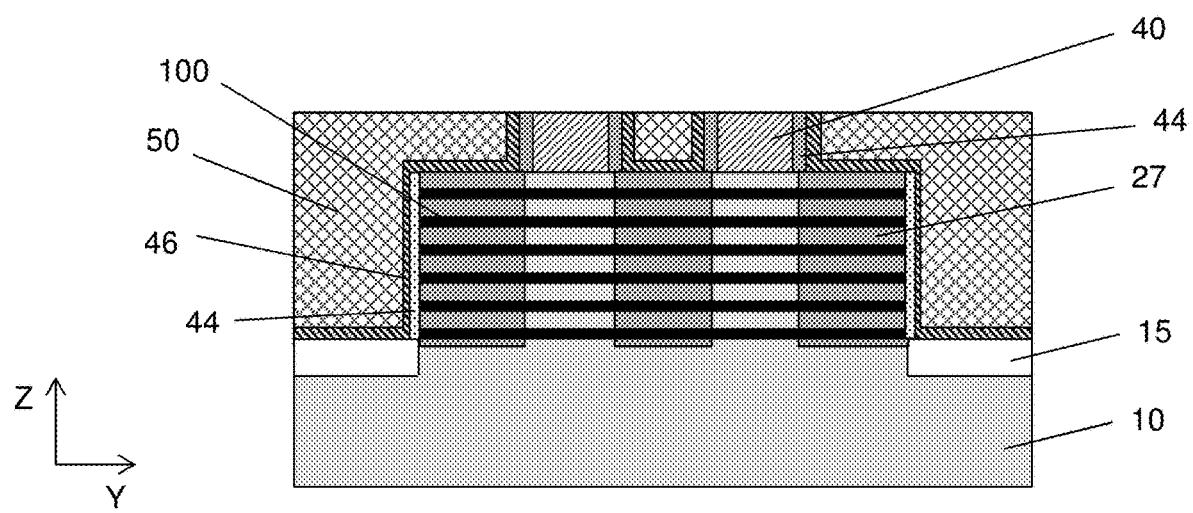

Subsequently, a liner layer 46, such as an etch stop layer, is formed to cover the gate structures 40 with the sidewall spacer 44 and the exposed fin structures 30. In some embodiments, the liner layer 46 includes a silicon nitride-based material, such as silicon nitride, SiON, SiOCN or SiCN and combinations thereof, formed by CVD, including LPCVD and PECVD, PVD, ALD, or other suitable process. In certain embodiments, the liner layer 46 is made of silicon nitride. Further, as shown in FIGS. 9A and 9B, a first interlayer dielectric (ILD) layer 50 is formed. The materials for the first ILD layer 50 include compounds comprising Si, 0, C and/or H, such as silicon oxide, SiCOH and SiOC. Organic materials, such as polymers, may be used for the first ILD layer 50. After the first ILD layer 50 is formed, a planarization operation, such as CMP, is performed, so that the sacrificial gate electrode layer 40 is exposed, as shown in FIGS. 9A and 9B.

Figure 10A:
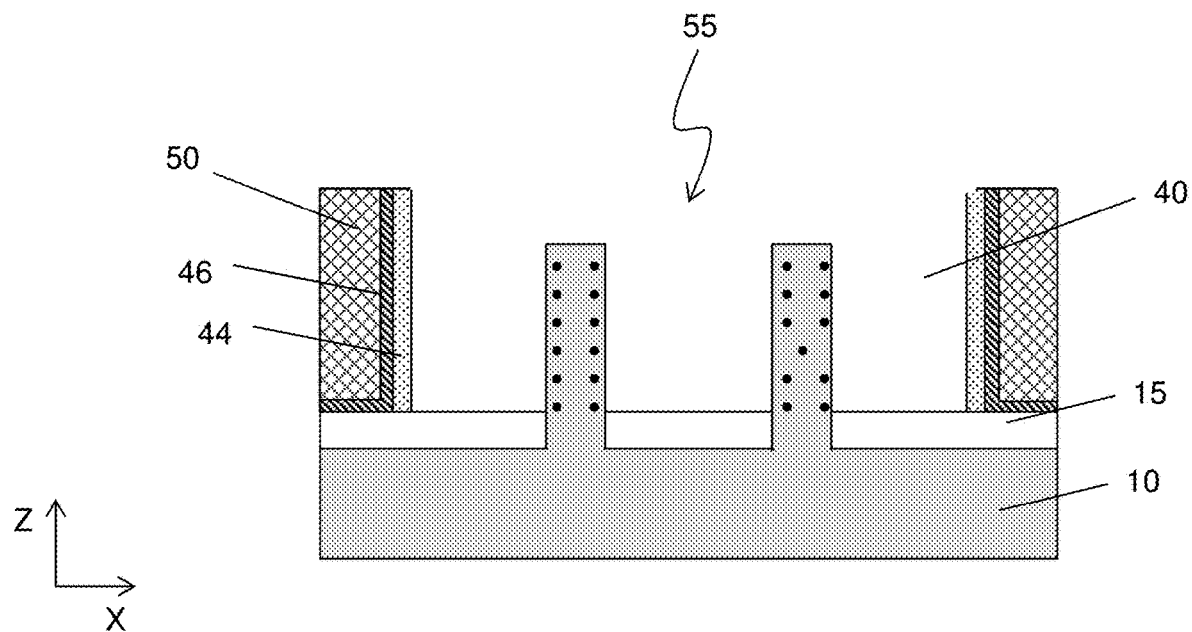
FIGS. 10A and 10B illustrate one of the various stages of a sequential fabrication process of a GAA FET using a CNT in accordance with an embodiment of the present disclosure.
Figure 10B:
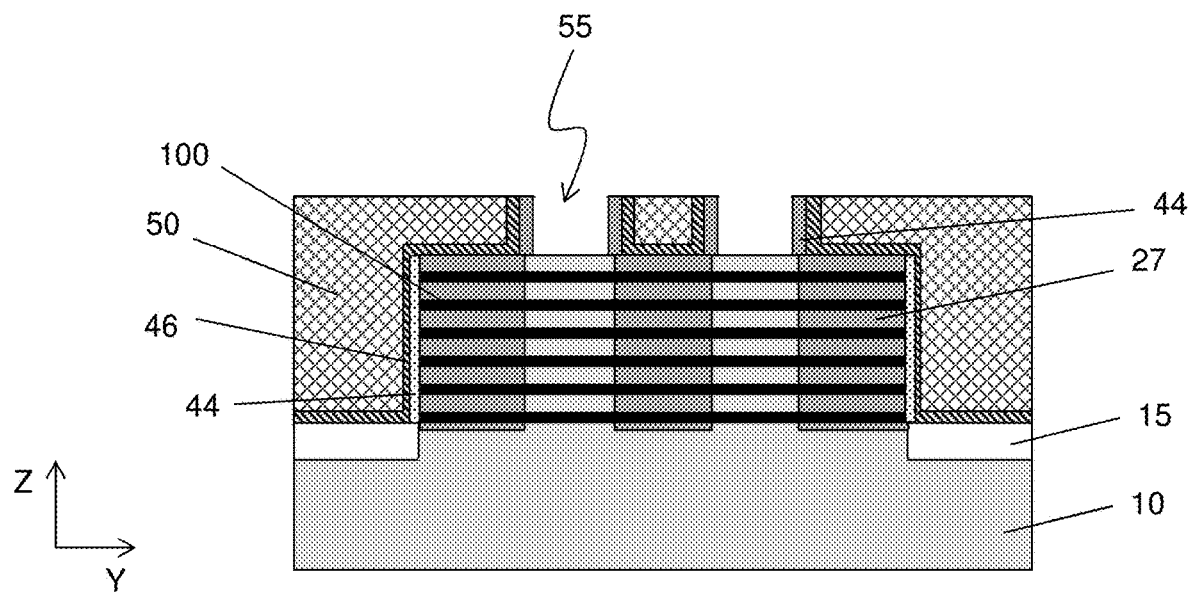

As shown in FIGS. 10A and 10B, the sacrificial gate electrode layer 40 is then removed, thereby exposing a channel region of the fin structures in a gate space 55. The sacrificial gate structure 40 can be removed using plasma dry etching and/or wet etching. When the sacrificial gate electrode layer 40 is polysilicon and the first ILD layer 50 is silicon oxide, a wet etchant such as a TMAH solution can be used to selectively remove the sacrificial gate electrode layer 40.

Figure 11A:
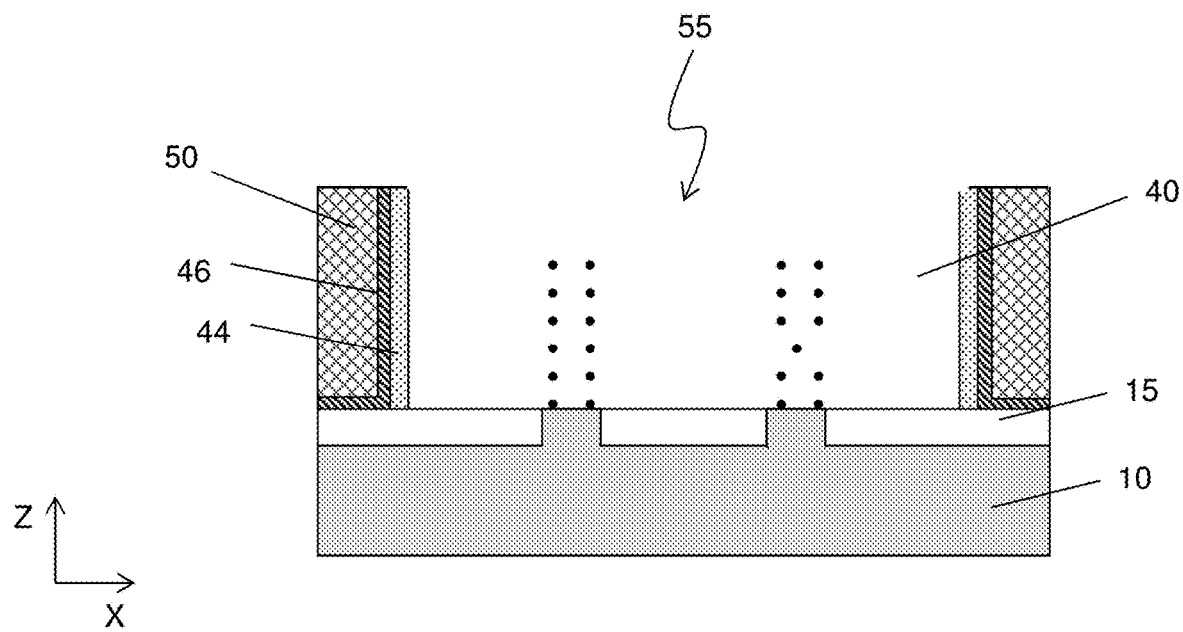
FIGS. 11A and 11B illustrate one of the various stages of a sequential fabrication process of a GAA FET using a CNT in accordance with an embodiment of the present disclosure.
Figure 11B:
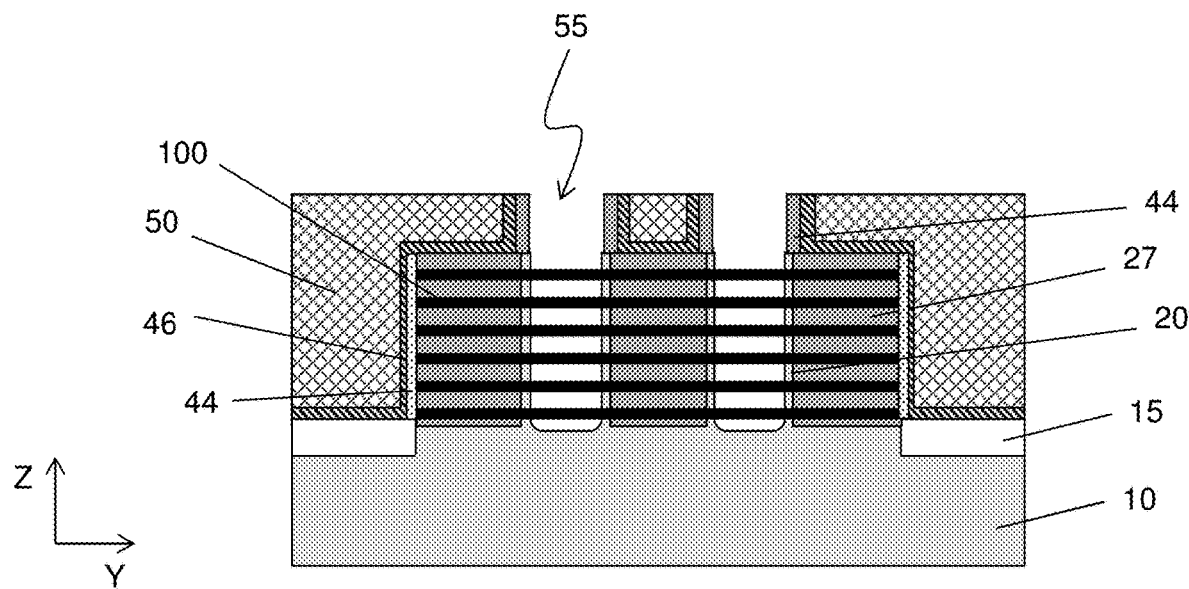

Further, as shown in FIGS. 11A and 11B, the support layer 20 in the gate space 55 is removed to release the CNTs 100. The support layer 20 can be removed selectively to the CNTs 100 using plasma dry etching and/or wet etching. In some embodiments, when the support layer 20 is silicon, the silicon layer is oxidized into silicon oxide, and the silicon oxide is removed by appropriate dry and/or wet etching. In some embodiments, as shown in FIG. 11B, part the support layer 20 remains under the sidewall spacer 44.

Figure 12A:
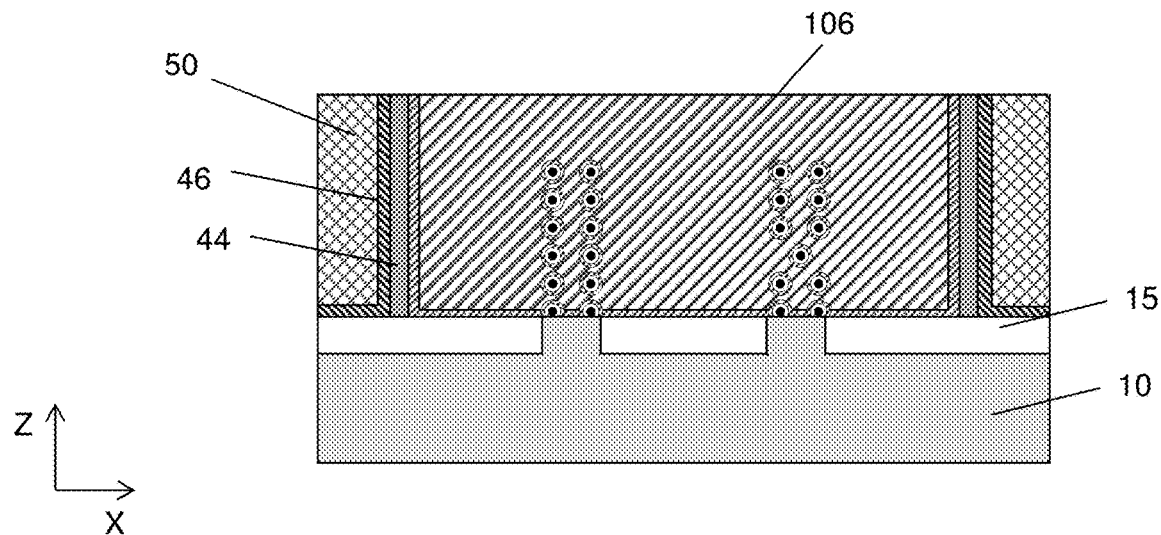
FIGS. 12A, 12B, 12C, 12D and 12E illustrate one of the various stages of a sequential fabrication process of a GAA FET using a CNT in accordance with an embodiment of the present disclosure.
Figure 12B:
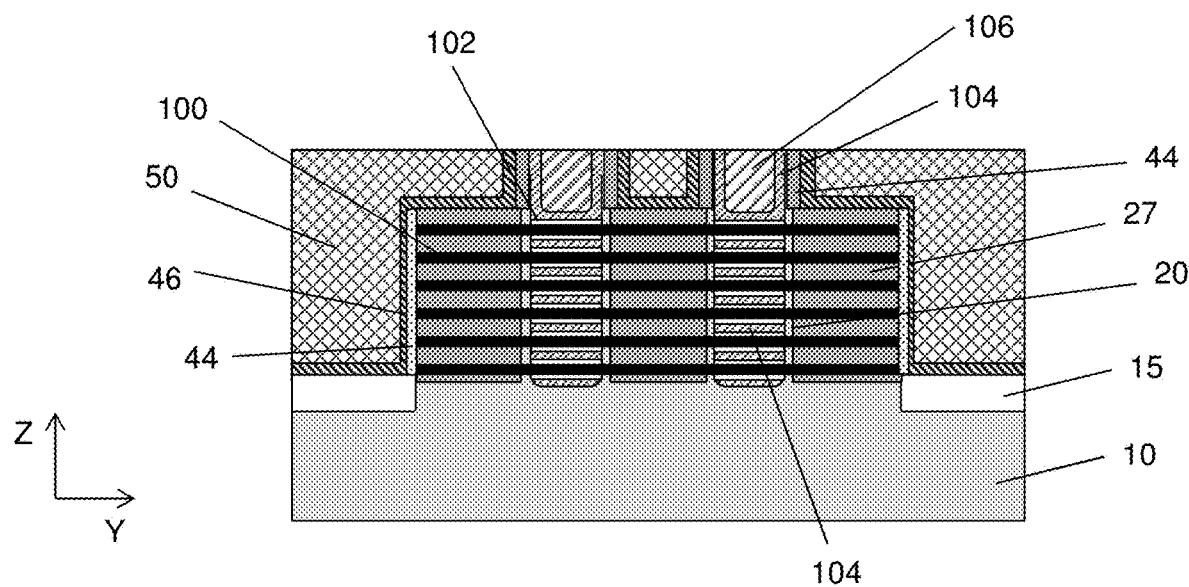
Figure 12C:
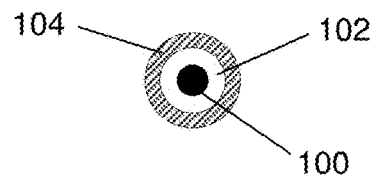
Figure 12D:
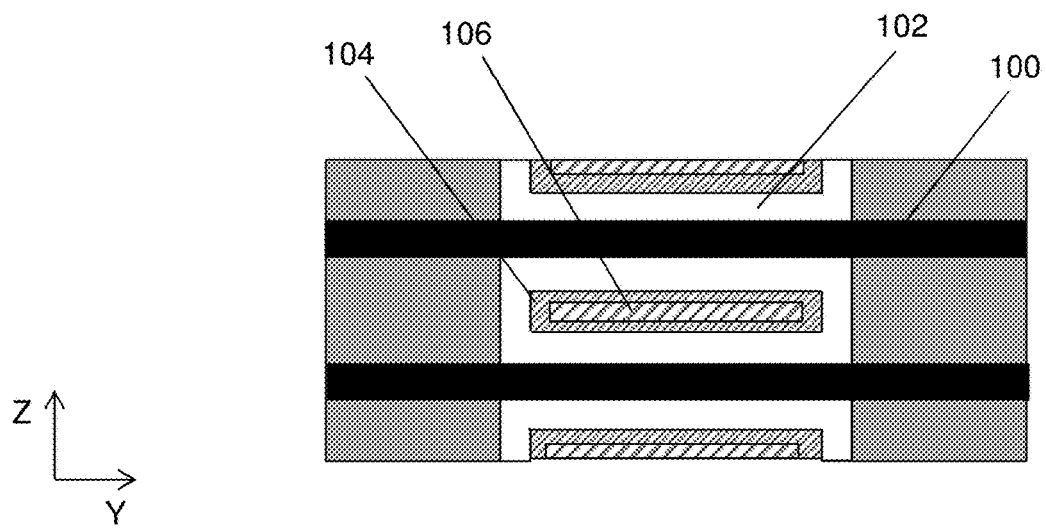

After the channel regions of the CNTs 100 are released, a gate dielectric layer 102 is formed around the CNTs 100, as shown in FIGS. 12A-12D. FIG. 12C is an enlarged view of the gate structure. In some embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 102 is made of HfO$_2$ for an n-channel FET, and is made of Al$_2$O$_3$ for a p-channel FET. The gate dielectric layer 102 has a thickness in a range from about 0.5 nm to about 2.5 nm in some embodiments, and has a thickness in a range from about 1.0 nm to about 2.0 nm in other embodiments. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel region of the CNTs 100.

In some embodiments, an interfacial layer (not shown) is formed around the CNTs before the gate dielectric layer 102 is formed. The interfacial layer is made of, for example, SiO$_2$ and has a thickness in a range from about 0.5 nm to about 1.5 nm in some embodiments. In other embodiments, the thickness of the interfacial layer is in a range from about 0.6 nm to about 1.0 nm.

In certain embodiments, one or more work function adjustment layers 104 are formed on the gate dielectric layer 102. The work function adjustment layers 104 are made of a conductive material such as a single layer of TiN, TaN, TaAlC, TiC, TaC, Co, Al, TiAl, HfTi, TiSi, TaSi or TiAlC, or a multilayer of two or more of these materials. In certain embodiments, TiN is used as the work function adjustment layer 104. The work function adjustment layer 104 may be formed by ALD, PVD, CVD, e-beam evaporation, or other suitable process. Further, the work function adjustment layer 104 may be formed separately for the n-channel FET and the p-channel FET which may use different metal layers. The work function adjustment layer 104 has a thickness in a range from about 0.5 nm to about 5.0 nm in some embodiments, and has a thickness in a range from about 0.8 nm to about 1.5 nm in other embodiments.

Then, as shown in FIGS. 12A-12D, a gate electrode layer 106 is formed over the work function adjustment layer 104. The gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 106 may be formed by CVD, ALD, electro-plating, or other suitable method. The gate electrode layer 106 is also deposited over the upper surface of the first ILD layer 50, and the gate dielectric layer 102, the work function adjustment layer 104 and the gate electrode layer 106 formed over the first ILD layer 50 are then planarized by using, for example, CMP, until the first ILD layer 50 is revealed.

Figure 12E:
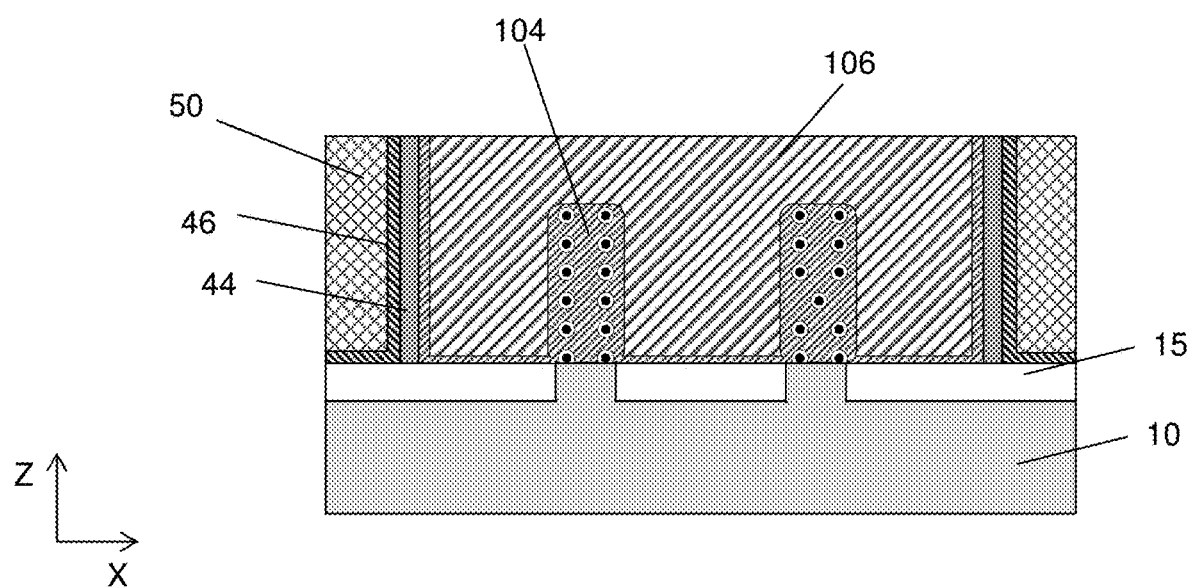

In FIGS. 12A-12D, the gate dielectric layer fully wraps around each of the CNTs 100, the work function adjustment layer 104 also fully wraps around each of the CNTs 100, and spaces formed between the work function adjustment layer 104 of adjacent CNTs 100 are filled by the gate electrode layer 106. In other embodiments, as shown in FIG. 12E, the work function adjustment layer 104 fills spaces between the gate dielectric layer 102 of adjacent CNTs 100, and the gate electrode layer 106 covers the outer surface of the work function adjustment layer 104.

In some embodiments, before the gate dielectric layer 102 is formed, insulating inner spacers are formed around the CNTs 100 under the sidewall spacers 44. In some embodiments, an insulating layer is conformally formed inside of the gate space 55 by, for example, ALD or CVD. In some embodiments, the insulating layer is made of silicon oxide, silicon nitride, SiON, SiCN, SiOC, SiOCN or any other suitable material. The insulating layer is then etched to form the insulating inner spacers on ends of the support layers 20 around the CNTs 100 under the sidewall spacers 44.

In some embodiments, as shown in FIG. 12B, part of the support layer 20 (semiconductor layer) is disposed between the gate structure and the doped source/drain region 27. The part of the support layer 20 has a lower impurity concentration than the doped region 27.

Figure 13A:
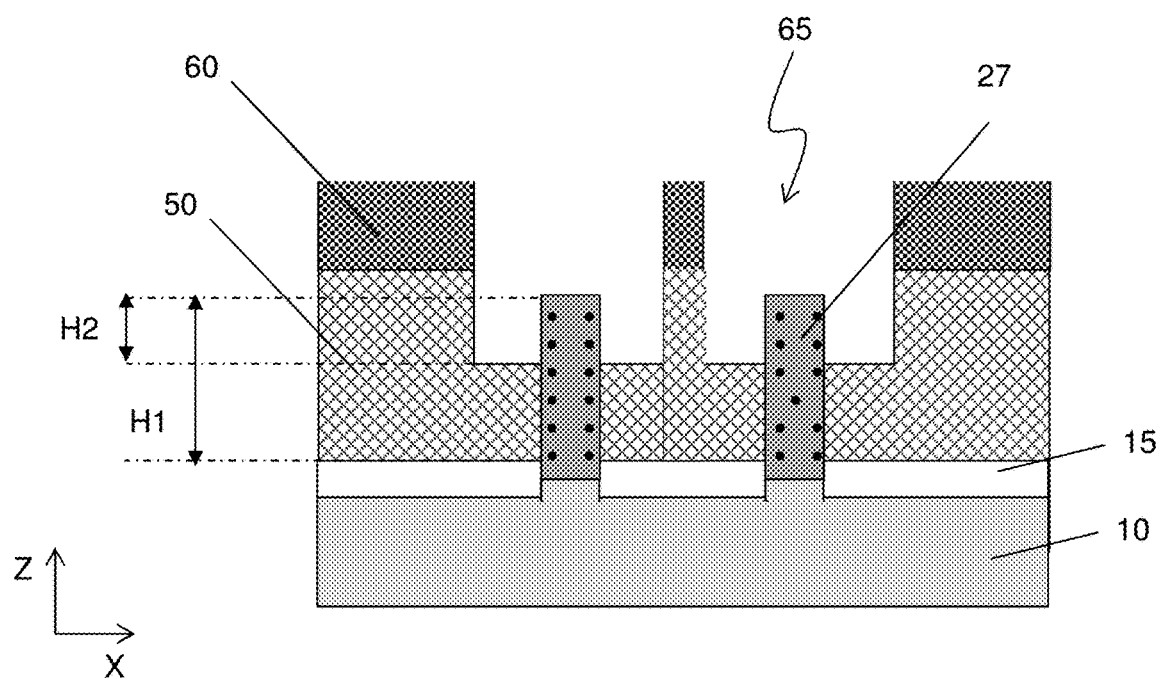
FIGS. 13A and 13B illustrate one of the various stages of a sequential fabrication process of a GAA FET using a CNT in accordance with an embodiment of the present disclosure.
Figure 13B:
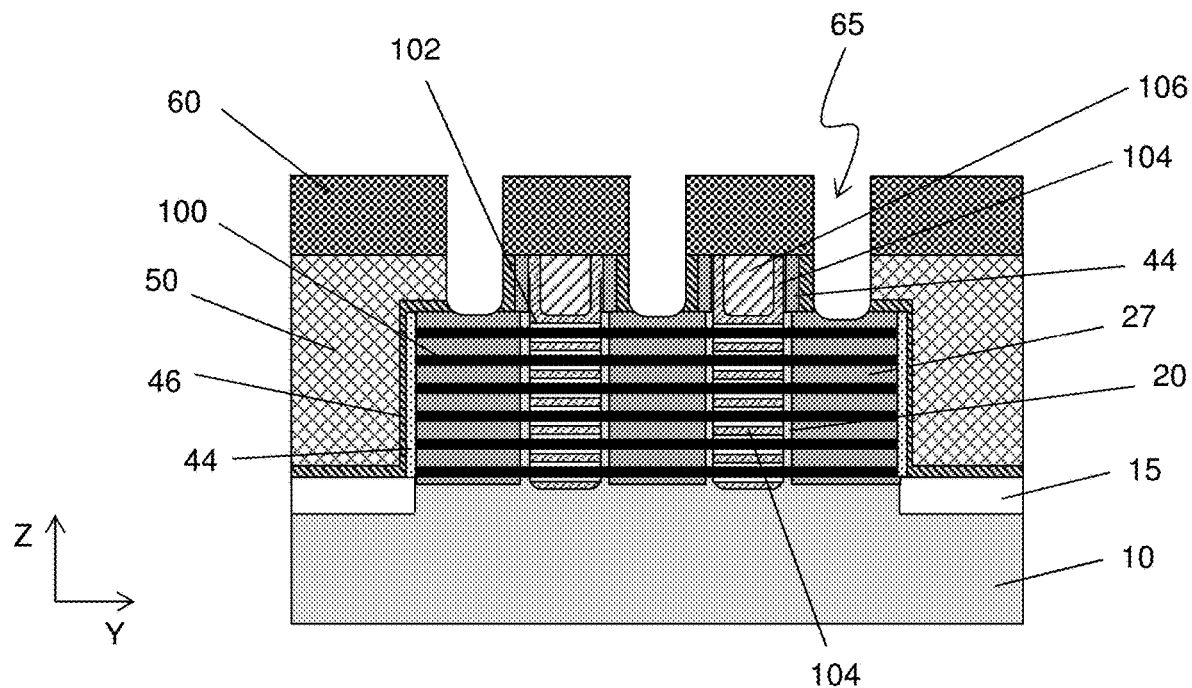

Then, as shown in FIGS. 13A and 13B, a second ILD layer 60 is formed over the first ILD layer 50, and source/drain contact openings 65 are formed by using one or more lithography and etching operations. FIG. 13A shows a cross sectional view cutting the source/drain region of the fin structure. In some embodiments, the second ILD layer 60 is patterned such that a part of the fin structure is exposed from the second ILD layer 60 as shown in FIG. 13A. In some embodiments, only the top surface of the fin structure is exposed. In other embodiments, about 20% to about 80% of the height (H1) of fin structure measured from the upper surface of the isolation insulating layer 15 is exposed, i.e. $0.2H1 \leq H2 \leq 0.8H1$, where H2 is the height of the exposed portion. In other embodiments, substantially the entire fin structure above the isolation insulating layer 15 is exposed.

Figure 14A:
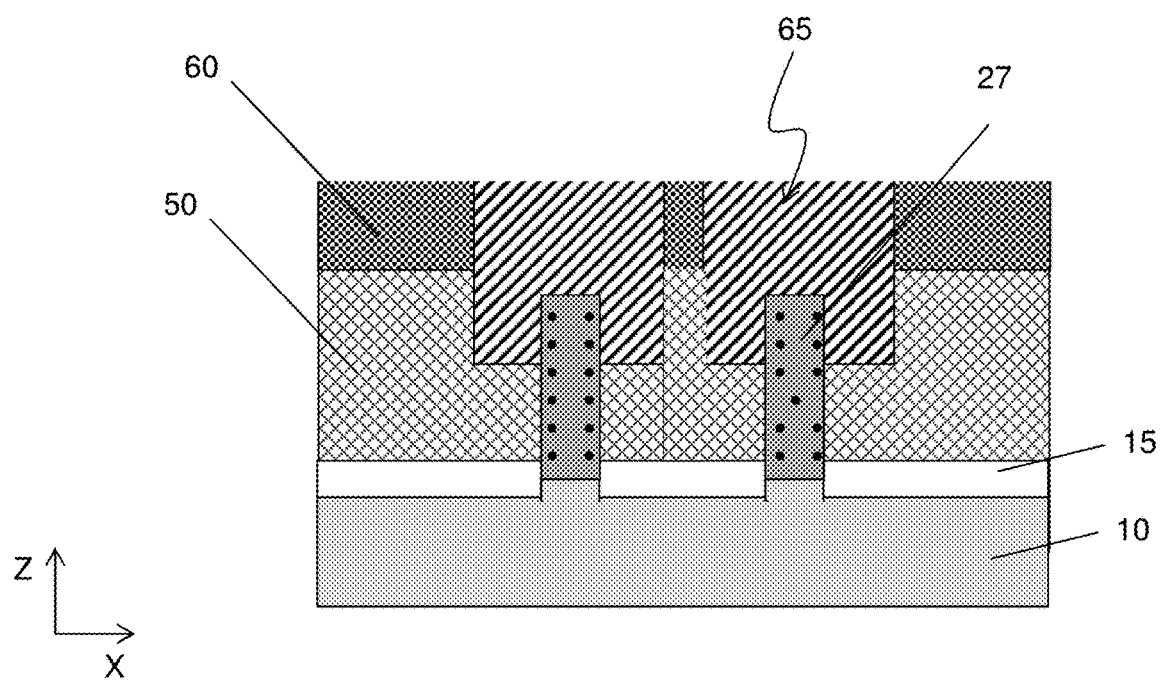
FIGS. 14A and 14B illustrate one of the various stages of a sequential fabrication process of a GAA FET using a CNT in accordance with an embodiment of the present disclosure.
Figure 14B:
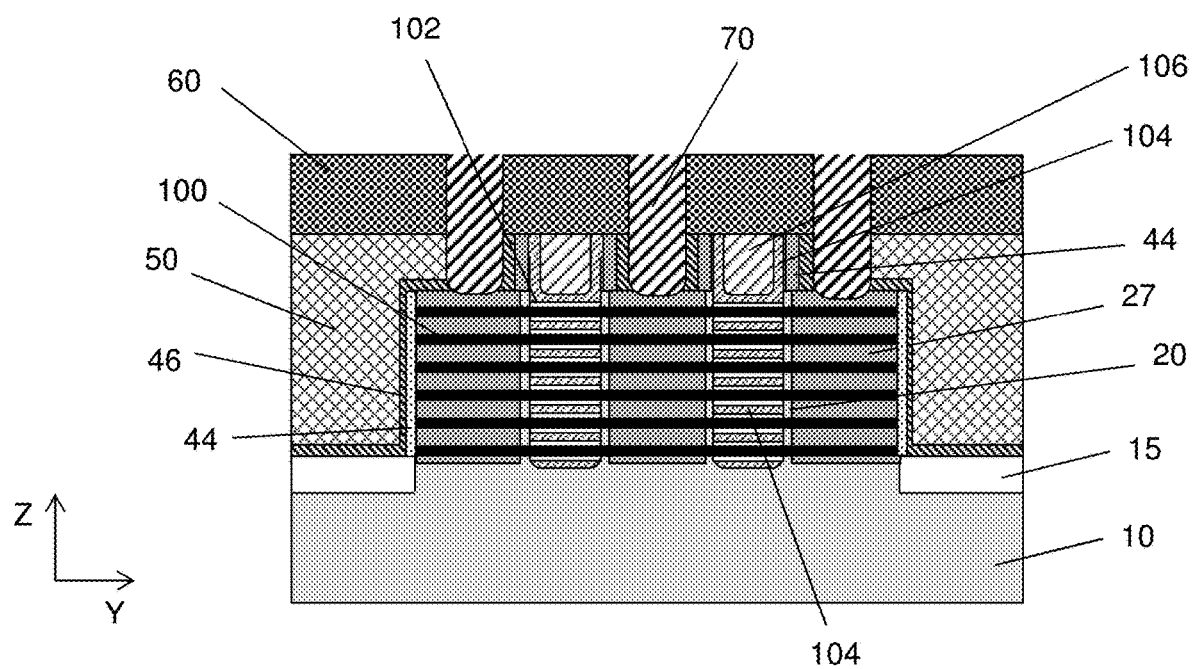

Next, as shown in FIGS. 14A and 14B, the source/drain contact openings 65 are filled with one or more layers of a conductive material to form a source/drain contact layer 70. The conductive material includes one or more of W, Cu, Ti, Ag, Al, TiAl, TiAlN, TaC, TaCN, TaSiN, Mn, Co, Pd, Ni, Re, Jr, Ru, Pt, and Zr, or any other suitable conductive materials.

In some embodiments, the source/drain contact layer 70 includes one or more of TiN, Ti and TaN as a lower layer and one or more of W, Cu and Co as an upper layer. Further, in some embodiments, one or more gate contacts are formed at the same time as the source/drain contacts or by different operations from the source/drain contacts. In some embodiments, a silicide layer is formed between the fin structure and the source/drain contact layer 70. The silicide layer includes NiSi, CoSi and WSi in some embodiments.

As shown in FIGS. 14A and 14B, the CNTs include multiple groups of CNTs, separated by support layers. The CNTs in the same group are located at a same height, and the multiple groups are located at different heights from each other.

Subsequently, further CMOS processes are performed to form various features such as additional interlayer dielectric layers, contacts/vias, interconnect metal layers, and passivation layers, etc.

FIGS. 15-21 illustrate various stages of a sequential fabrication process of a GAA FET using a CNT in accordance with another embodiment of the present disclosure. It is understood that additional operations can be provided before, during, and after processes shown by FIGS. 15-21, and some of the operations described below can be replaced or eliminated, for additional embodiments of the method. The order of the operations/processes may be interchangeable. Materials, configurations, dimensions, processes and/or operations same as or similar to those described with respect to FIGS. 1A-14B may be employed in the following embodiments and the detailed explanation may be omitted.

Figure 15:
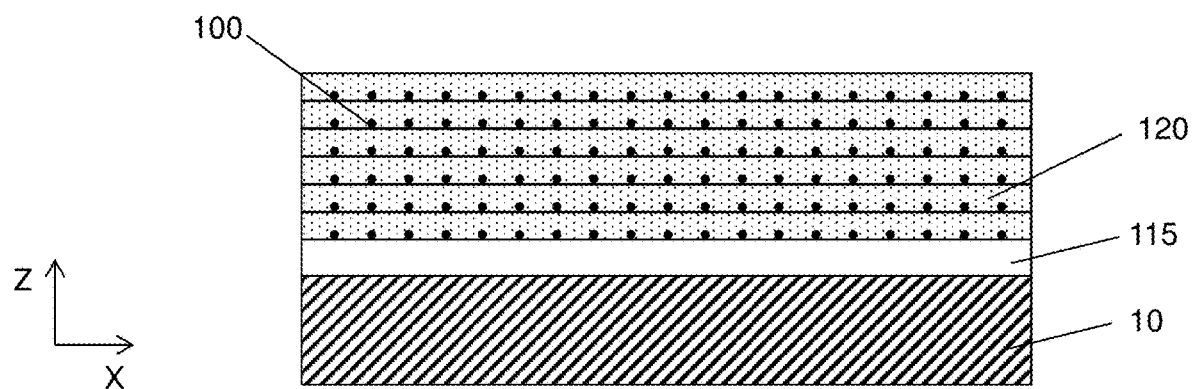
FIG. 15 shows one of the various stages of a sequential fabrication process of a GAA FET using a CNT in accordance with another embodiment of the present disclosure.

As shown in FIG. 15, a bottom support layer 115 is formed over a substrate 10. The bottom support layer 115 is made of an insulating material in some embodiments. In some embodiments, the bottom support layer includes one or more layers of silicon oxide, silicon nitride, SiON, SiOC, SiOCN and SiCN, or other suitable insulating material. In other embodiments, the bottom support layer includes a polycrystalline or amorphous material of one of Si, Ge and SiGe. The bottom support layer 115 can be formed by suitable film formation methods, such as thermal oxidation, chemical vapor deposition (CVD), physical vapor deposition (PVD) or atomic layer deposition (ALD). In certain embodiments, silicon oxide (e.g., $SiO_2$) is used as the bottom support layer 115. Then, similar to FIG. 1B, one or more carbon nanotubes (CNTs) 100 are arranged over the bottom support layer 115. In some embodiments, the bottom support layer is not used and the CNTs 100 are directly disposed on the substrate 10.

After the CNTs 100 are disposed onto the bottom support layer 115, a first support layer 120 is formed over the CNTs (a first group of CNTs) disposed on the bottom support layer 115, as shown in FIG. 15. In some embodiments, the support layer 120 includes a polycrystalline or amorphous material of one of Si, Ge and SiGe. In other embodiments, the support layer 120 includes one or more layers of silicon oxide, silicon nitride, SiON, SiOC, SiOCN and SiCN, or other suitable insulating material. In some embodiments, the support layer 120 includes organic material, such as organic polymers. In certain embodiments, the support layer 120 is made of a different material than the bottom support layer 115. In other embodiments, the support layer 120 is made of the same material as the bottom support layer 115. The support layer 120 can be formed by suitable film formation methods, such as CVD, PVD or ALD. In one embodiment, ALD is used for its high thickness uniformity and thickness controllability. Disposing CNTs 100 and forming a support layer 120 are repeated to form a stacked structure as shown in FIG. 15.

Figure 16:
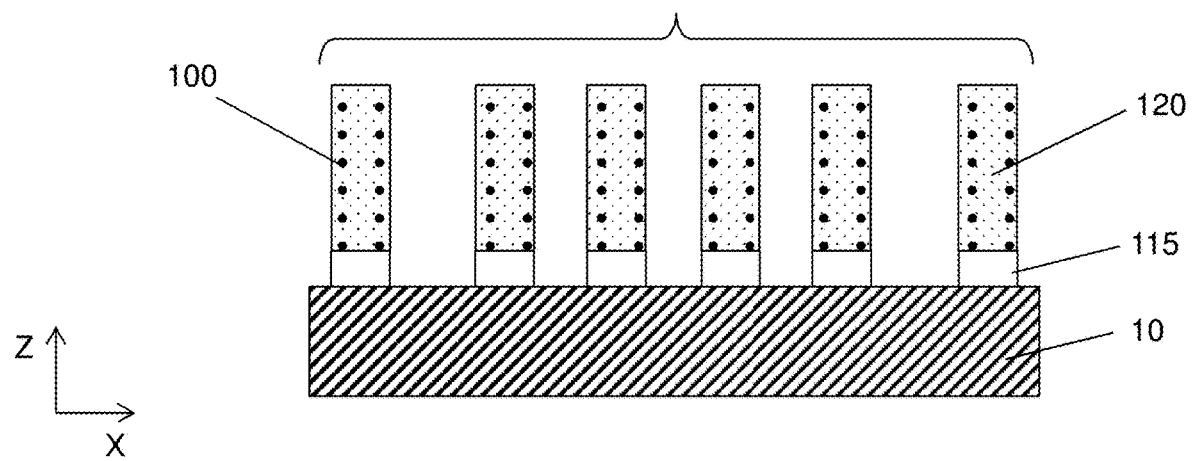
FIG. 16 shows one of the various stages of a sequential fabrication process of a GAA FET using a CNT in accordance with another embodiment of the present disclosure.

Similar to FIG. 3, by using one or more lithography and etching operations, a mask pattern is formed over the support layer 20, and the support layer 20 with the CNTs 100 is patterned into one or more fin structures 30 as shown in FIG. 16. In FIG. 16, the bottom support layer 115 is made of the same material as or similar material the support layers 20 and thus the bottom support layer 115 is also patterned into the fin structure. When the bottom support layer 115 is made of a different material than the support layers 20, the bottom support layer 115 may not be patterned.

Figure 17:
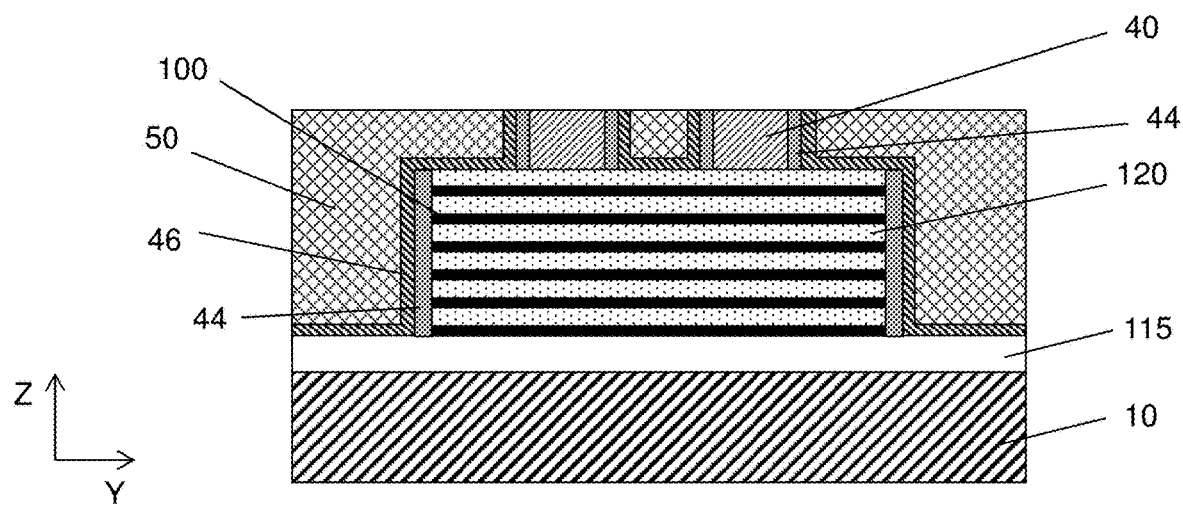
FIG. 17 shows one of the various stages of a sequential fabrication process of a GAA FET using a CNT in accordance with another embodiment of the present disclosure.

Subsequently, similar to FIGS. 6A, 6B, 7A, 7B, 9A and 9B, a sacrificial gate structure 40 is formed over the fin structures 30. Subsequently, and gate sidewall spacers 44 are formed. Subsequently, a liner layer 46, such as an etch stop layer, is formed to cover the gate structures 40 with the sidewall spacer 44 and the exposed fin structures 30, and a first interlayer dielectric (ILD) layer 50 is formed. After the first ILD layer 50 is formed, a planarization operation, such as CMP, is performed, so that the sacrificial gate electrode layer 40 is exposed, as shown in FIG. 17.

Figure 18:
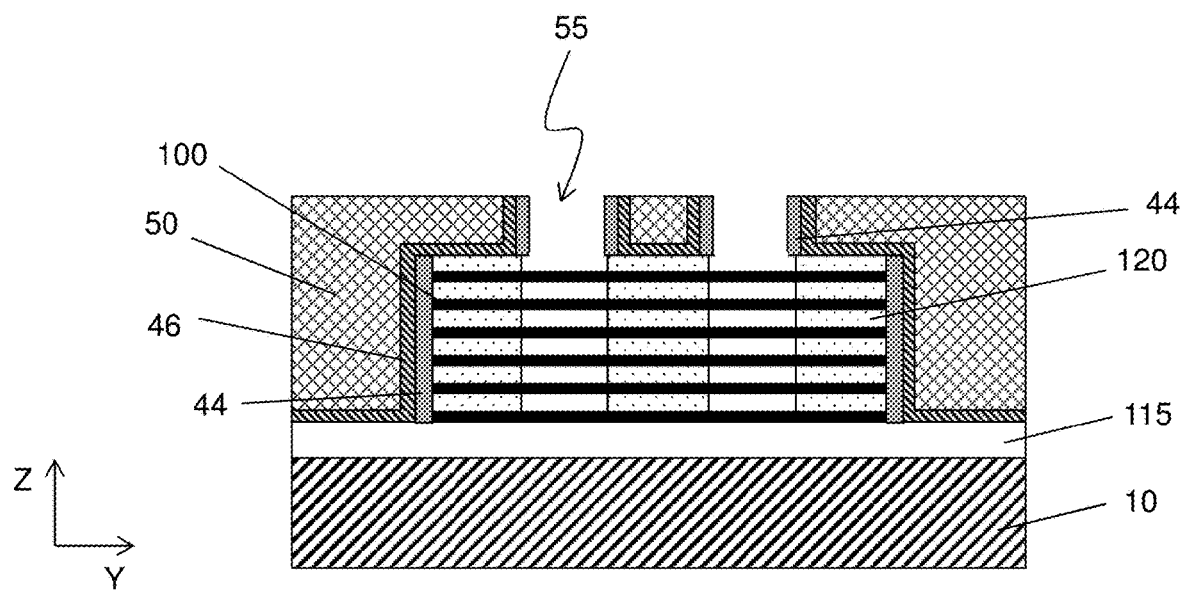
FIG. 18 shows one of the various stages of a sequential fabrication process of a GAA FET using a CNT in accordance with another embodiment of the present disclosure.
Figure 19:
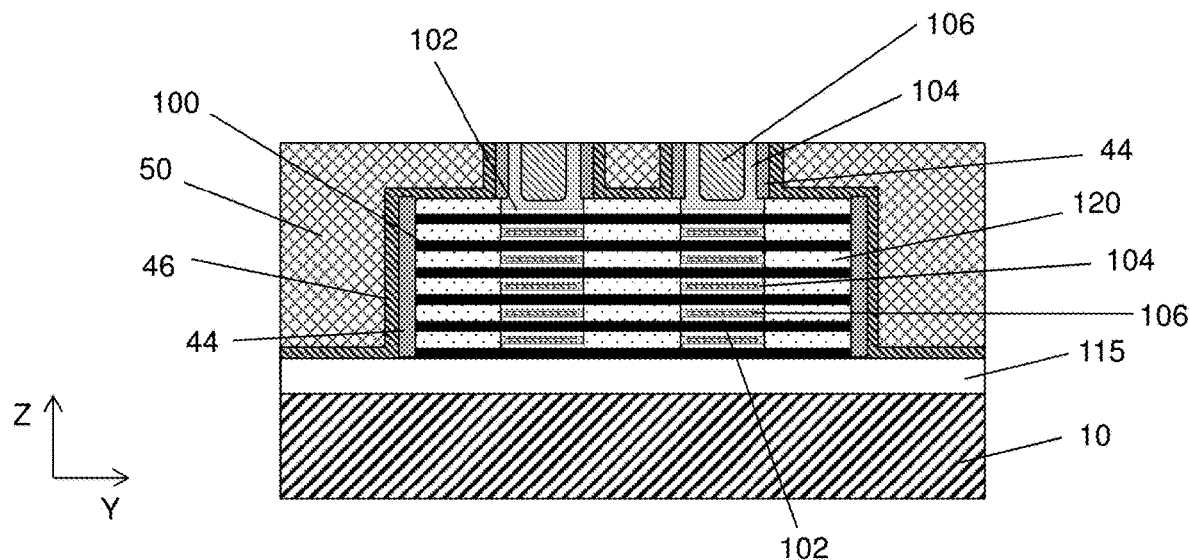
FIG. 19 shows one of the various stages of a sequential fabrication process of a GAA FET using a CNT in accordance with another embodiment of the present disclosure.

Then, as shown in FIG. 18, the sacrificial gate electrode layer 40 is removed, thereby exposing a channel region of the fin structures in a gate space 55. Further, the support layer 20 in the gate space 55 is removed to release the CNTs 100. After the channel regions of the CNTs 100 are released, a gate dielectric layer 102 is formed around the CNTs 100, a work function adjustment layer 104 is formed over the gate dielectric layer and a gate electrode layer 106 is formed over the work function adjustment layer 104, as shown in FIG. 19.

Figure 20:
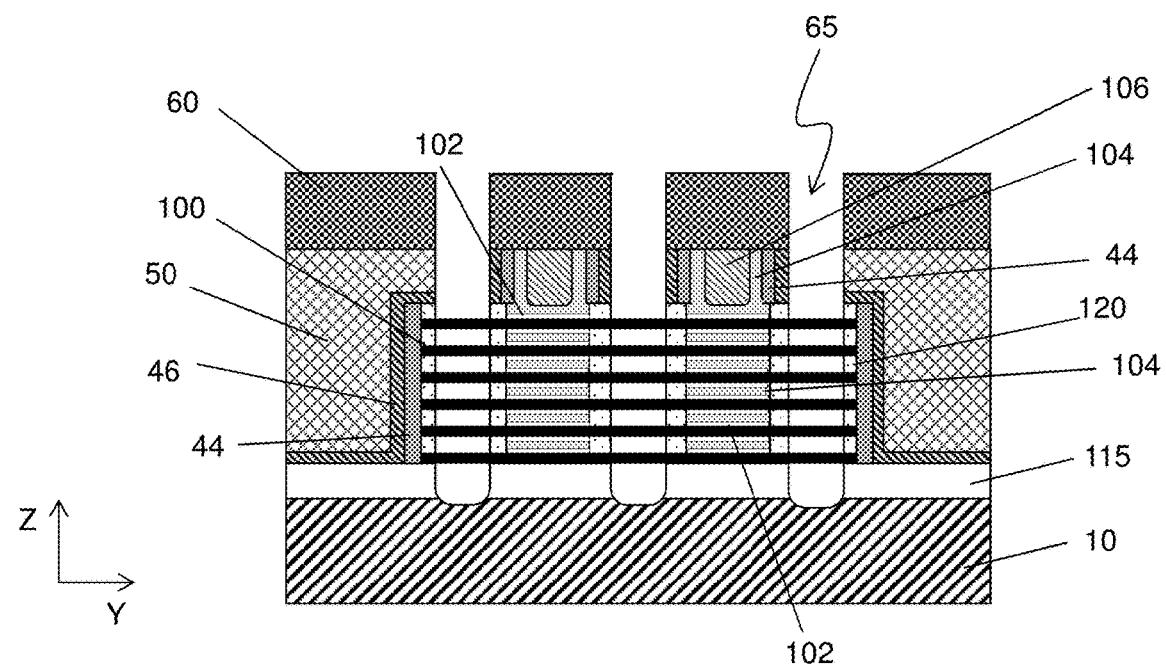
FIG. 20 shows one of the various stages of a sequential fabrication process of a GAA FET using a CNT in accordance with another embodiment of the present disclosure.

Then, as shown in FIG. 20, a second ILD layer 60 is formed over the first ILD layer 50, and source/drain contact openings 65 are formed by using one or more lithography and etching operations. By this operation, source/drain regions of the CNTs 100 are exposed in the source/drain contact openings 65. In some embodiments, the source/drain contact opening 65 reaches the substrate 10 as shown in FIG. 20. In some embodiments, as shown in FIG. 12B, a part of the support layer 20 remains under the sidewall spacers 44. When the support layer 20 is made of a dielectric material, the remaining support layer 20 functions as insulating inner spacers separating the gate electrode layer 106 and subsequently formed source/drain contact.

Figure 21:
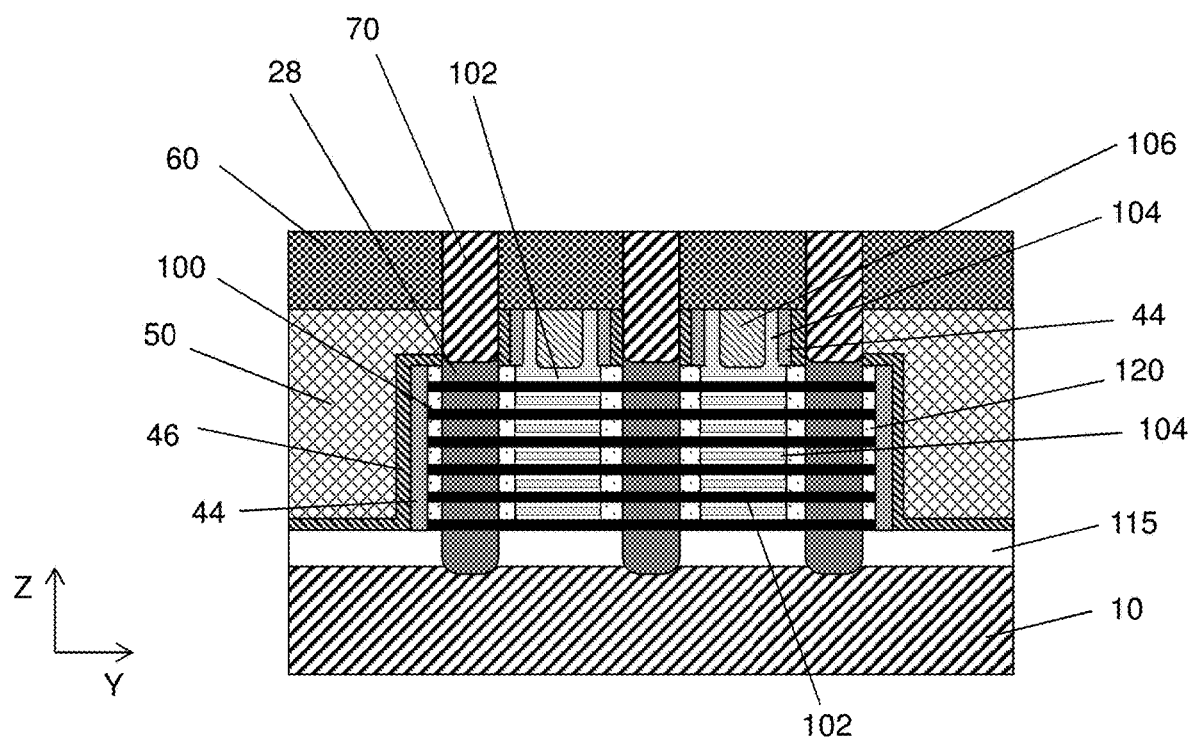
FIG. 21 shows one of the various stages of a sequential fabrication process of a GAA FET using a CNT in accordance with another embodiment of the present disclosure.

Next, as shown in FIG. 21, a semiconductor layer 28 is formed in the source/drain contact openings 65 to wrap around the CNTs 100. In some embodiments, the semiconductor layer 28 is epitaxially formed over the exposed substrate 10. In some embodiments, the semiconductor layer 28 is crystalline silicon or SiGe doped with impurities (e.g., in-situ doping), such as P and/or As for an n-type FET and B and/or Ga for a p-type FET. In other embodiments, the semiconductor layer 28 is polycrystalline or amorphous silicon or SiGe doped with impurities, such as P and/or As for an n-type FET and B and/or Ga for a p-type FET. In some embodiments, an impurity concentration in the semiconductor layer 28 is in a range from about $1 \times 10^{20}$ atoms/cm$^3$ to $1 \times 10^{21}$ atoms/cm$^3$. The impurity concentration in the semiconductor layer 28 is in a range from about $2 \times 10^{20}$ atoms/cm$^3$ to $5 \times 10^{20}$ atoms/cm$^3$ in other embodiments. Further, as shown in FIG. 21, a source/drain contact layer 70 is formed over the semiconductor layer 28. In some embodiments, before forming the source/drain contact layer 70, an etch-back operation is performed on the semiconductor layer 28. In some embodiments, before forming the source/drain contact layer 70, the second and the first ILD layers are patterned to form a wider source/drain opening, and then the source/drain opening is filled with the conductive material to form the source/drain contact layer 70.

Subsequently, further CMOS processes are performed to form various features such as additional interlayer dielectric layers, contacts/vias, interconnect metal layers, and passivation layers, etc.

FIGS. 22A-31B illustrate various stages of a sequential fabrication process of a planar type FET using a CNT in accordance with another embodiment of the present disclosure. It is understood that additional operations can be provided before, during, and after processes shown by FIGS. 22A-31B, and some of the operations described below can be replaced or eliminated, for additional embodiments of the method. The order of the operations/processes may be interchangeable. Materials, configurations, dimensions, processes and/or operations same as or similar to those described with respect to FIGS. 1A-21 may be employed in the following embodiments and the detailed explanation may be omitted. In FIGS. 22A-31B, the "A" figures are cross sectional views along the gate extending direction (X) in a source/drain region and the "B" figures are cross sectional views along the source-to-drain direction (Y) under the gate.

Figure 22A:
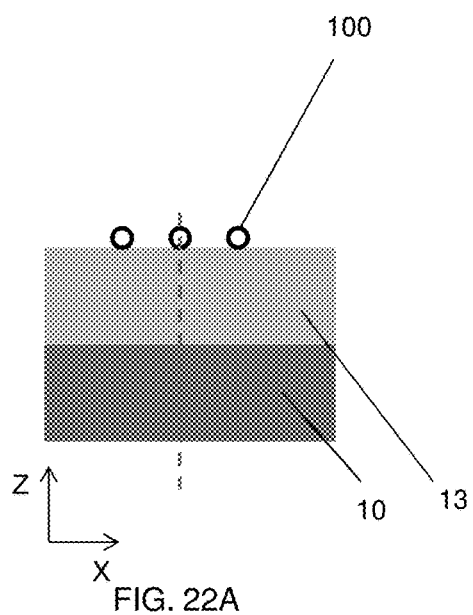
FIGS. 22A and 22B illustrate one of the various stages of a sequential fabrication process of an FET using a CNT in accordance with an embodiment of the present disclosure.
Figure 22B:
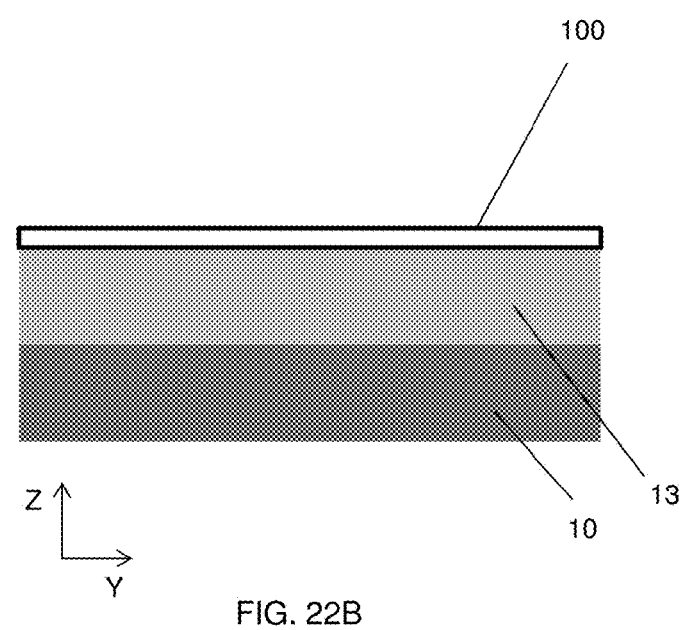
Figure 23A:
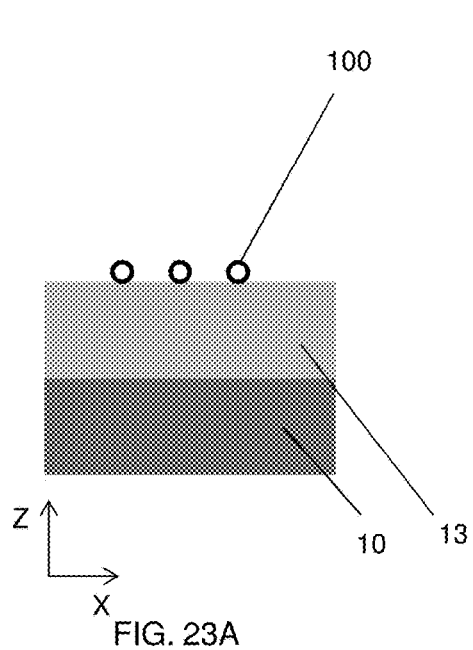
FIGS. 23A and 23B illustrate one of the various stages of a sequential fabrication process of an FET using a CNT in accordance with an embodiment of the present disclosure.
Figure 23B:
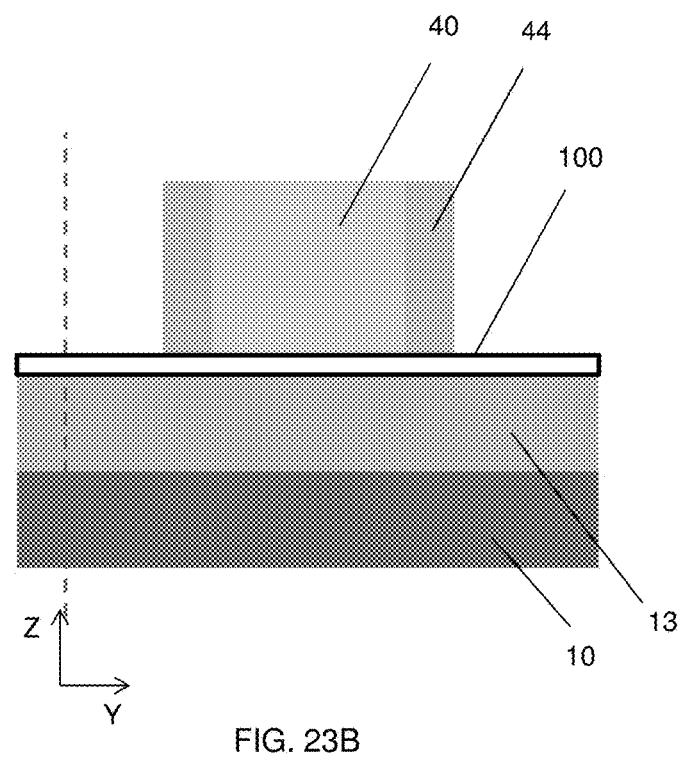

As shown in FIGS. 22A and 22B, a bottom support layer 13 is formed over a substrate 10. The bottom support layer 13 is made of an insulating material in some embodiments. In some embodiments, the bottom support layer includes one or more layers of silicon oxide, silicon nitride, SiON, SiOC, SiOCN and SiCN, or other suitable insulating material. The bottom support layer 13 can be formed by suitable film formation methods, such as thermal oxidation, CVD, PVD or ALD. In certain embodiments, silicon oxide (e.g., $SiO_2$) is used as the bottom support layer 13. After the CNTs 100 are disposed onto the bottom support layer 13, a sacrificial gate structure 40 is formed over the CNTs 100, and then, gate sidewall spacers 44 are formed, as shown in FIGS. 23A and 23B. In some embodiments, CNT trimming operations are performed to adjust the number of the CNTs and/or length of the CNTs.

Figure 25A:
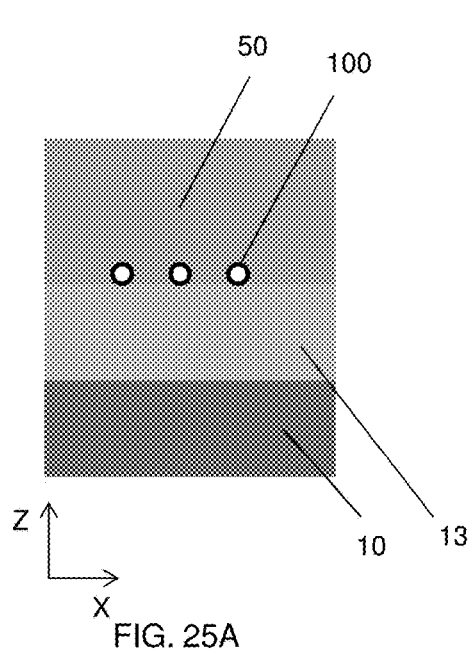
FIGS. 25A and 25B illustrate one of the various stages of a sequential fabrication process of an FET using a CNT in accordance with an embodiment of the present disclosure.
Figure 25B:
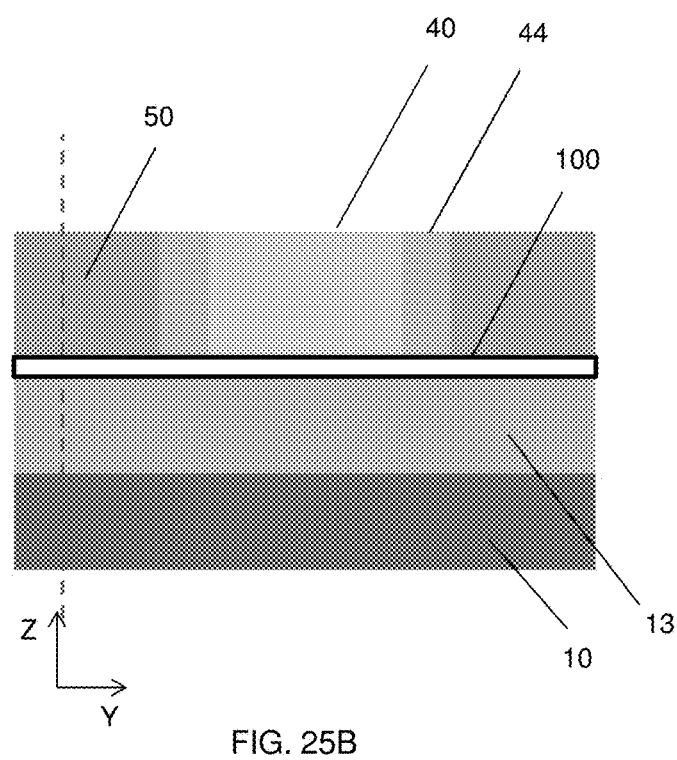

Subsequently, a first interlayer dielectric (ILD) layer 50 is formed, as shown in FIGS. 24A and 24B. After the first ILD layer 50 is formed, a planarization operation, such as CMP, is performed, so that the sacrificial gate electrode layer 40 is exposed, as shown in FIGS. 25A and 25B.

Figure 26A:
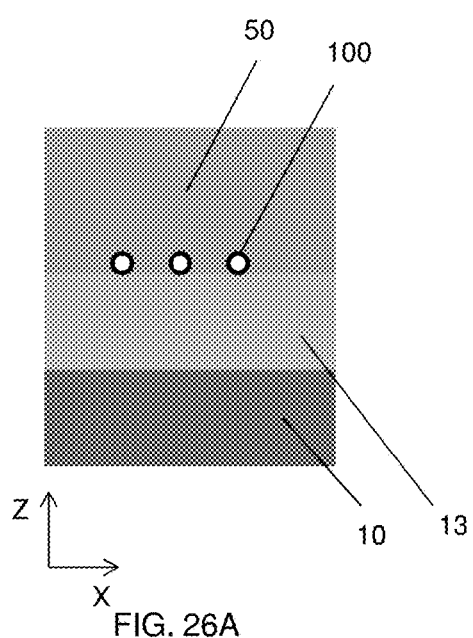
FIGS. 26A and 26B illustrate one of the various stages of a sequential fabrication process of an FET using a CNT in accordance with an embodiment of the present disclosure.
Figure 26B:
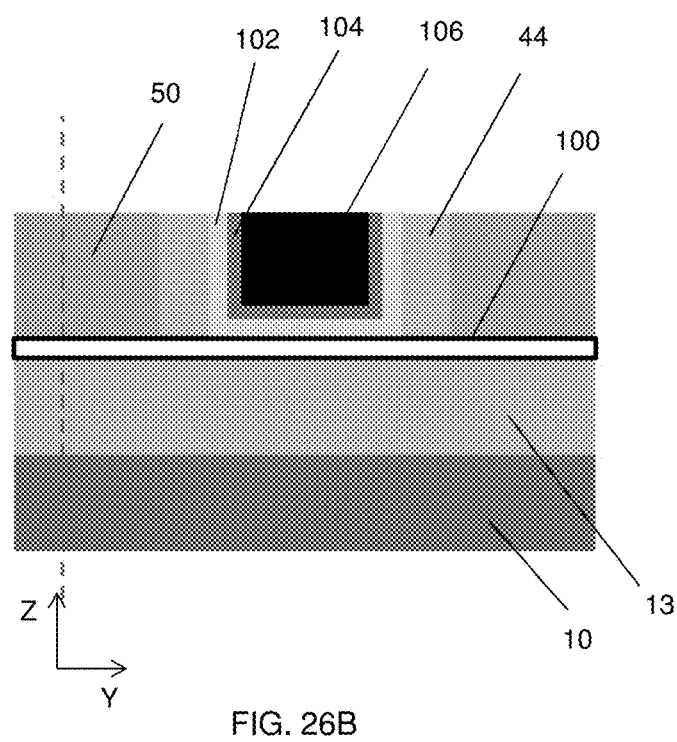

Then, the sacrificial gate electrode layer 40 is removed, thereby exposing a channel region of the CNTs 100. After the channel regions of the CNTs 100 are released, a gate dielectric layer 102 is formed around (but not fully surrounding) the CNTs 100, a work function adjustment layer 104 is formed over the gate dielectric layer and a gate electrode layer 106 is formed over the work function adjustment layer 104, as shown in FIGS. 26A and 26B.

Figure 28A:
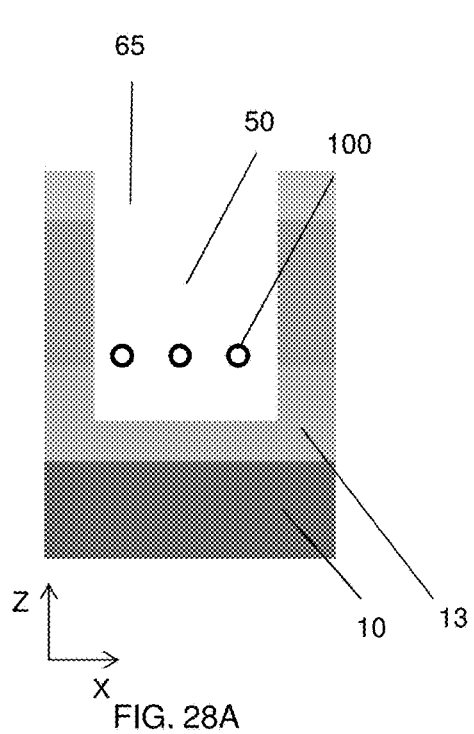
FIGS. 28A and 28B illustrate one of the various stages of a sequential fabrication process of an FET using a CNT in accordance with an embodiment of the present disclosure.
Figure 28B:
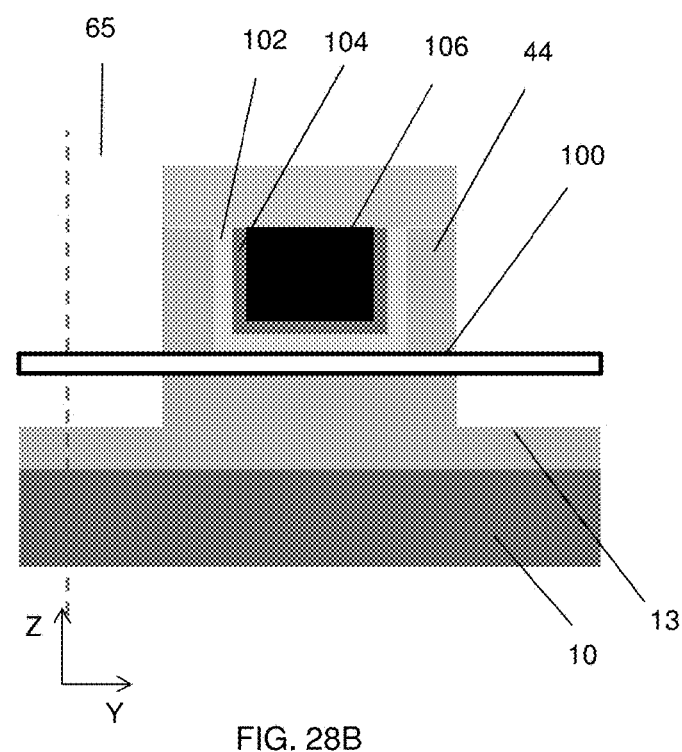

Then, as shown in FIGS. 27A and 27B, a second ILD layer 60 is formed over the first ILD layer 50, and source/drain contact openings 65 are formed by using one or more lithography and etching operations as shown in FIGS. 28A and 28B. By this operation, source/drain regions of the CNTs 100 are exposed in the source/drain contact openings 65. In some embodiments, as shown in FIGS. 28A and 28B, a part of the bottom support layer 12 remains.

Next, as shown in FIGS. 29A and 29B, a semiconductor layer 128 is formed in the source/drain contact openings 65 to wrap around the CNTs 100. In some embodiments, the semiconductor layer 128 is polycrystalline or amorphous silicon or SiGe doped with impurities, such as P and/or As for an n-type FET and B and/or Ga for a p-type FET. In some embodiments, an impurity concentration in the semiconductor layer 128 is in a range from about $1 \times 10^{20}$ atoms/cm$^3$ to $1 \times 10^{21}$ atoms/cm$^3$. The impurity concentration in the semiconductor layer 128 is in a range from about $2 \times 10^{20}$ atoms/cm$^3$ to $5 \times 10^{20}$ atoms/cm$^3$ in other embodiments. Further, as shown in FIGS. 29A and 29B, a source/drain contact layer 70 is formed over the semiconductor layer 128. In some embodiments, before forming the source/drain contact layer 70, an etch-back operation is performed on the semiconductor layer 128.

In some embodiments, as shown in FIGS. 30A and 30B, when the source/drain contact opening 65 is formed, the substrate 10 is exposed. The semiconductor layer 128 is epitaxially formed over the exposed substrate 10 as shown in FIGS. 31A and 31B. In some embodiments, the semiconductor layer 128 is crystalline silicon or SiGe doped with impurities, such as P and/or As for an n-type FET and B and/or Ga for a p-type FET.

Subsequently, further CMOS processes are performed to form various features such as additional interlayer dielectric layers, contacts/vias, interconnect metal layers, and passivation layers, etc.

Figure 32A:
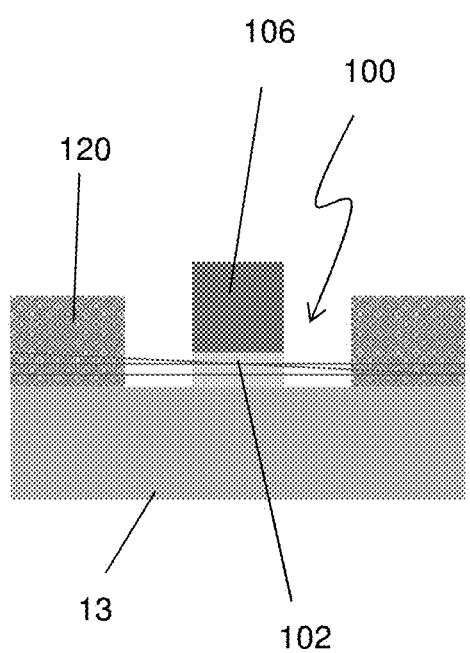
FIGS. 32A and 32B show a FET using a CNT in accordance with another embodiment of the present disclosure.
Figure 32B:
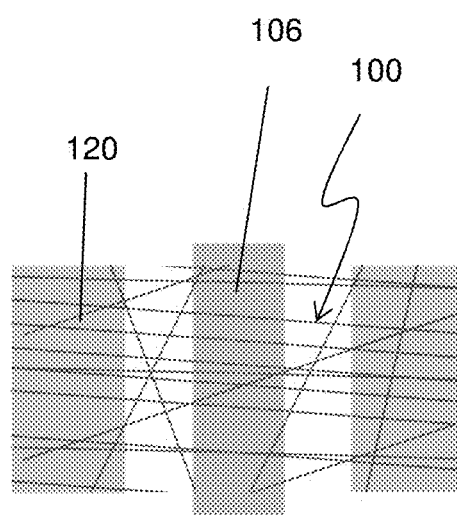

FIGS. 32A and 32B show a FET using a CNT in accordance with another embodiment of the present disclosure. Materials, configurations, dimensions, processes and/or operations same as or similar to those described with respect to FIGS. 1A-31B may be employed in the following embodiments and the detailed explanation may be omitted. In these embodiments, the CNTs 100 form a network. In some embodiments, the CNTs 100 are randomly disposed over the support layer 13 vertically and horizontally.

FIGS. 33A-33D show simulation results of doping to CNTs from a doped bulk semiconductor material.

Figure 33A:
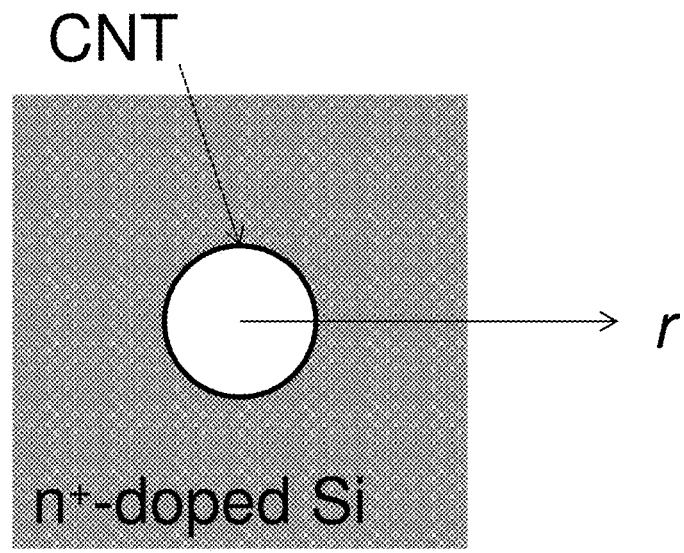
FIGS. 33A, 33B, 33C and 33D show simulation results showing doping of CNTs from a doped bulk semiconductor material.
Figure 33B:
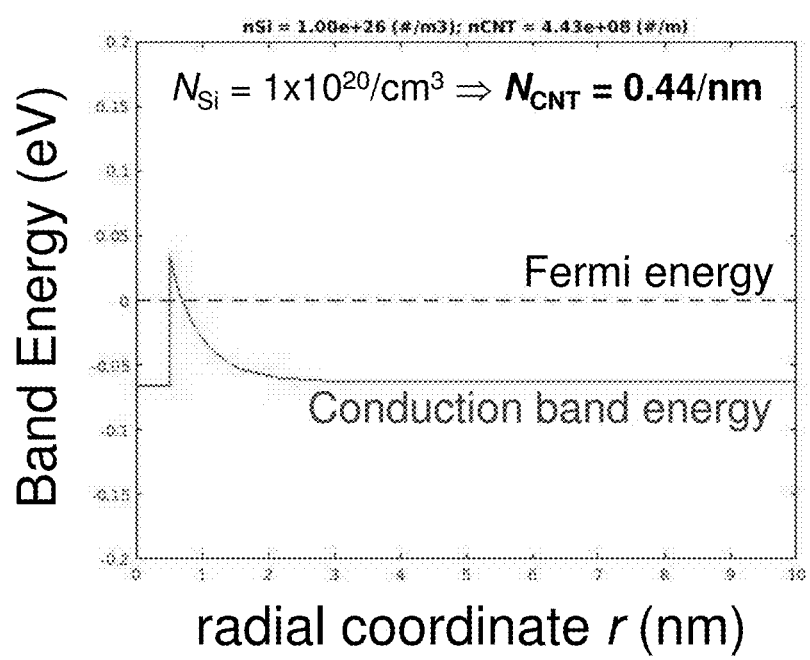
Figure 33C:
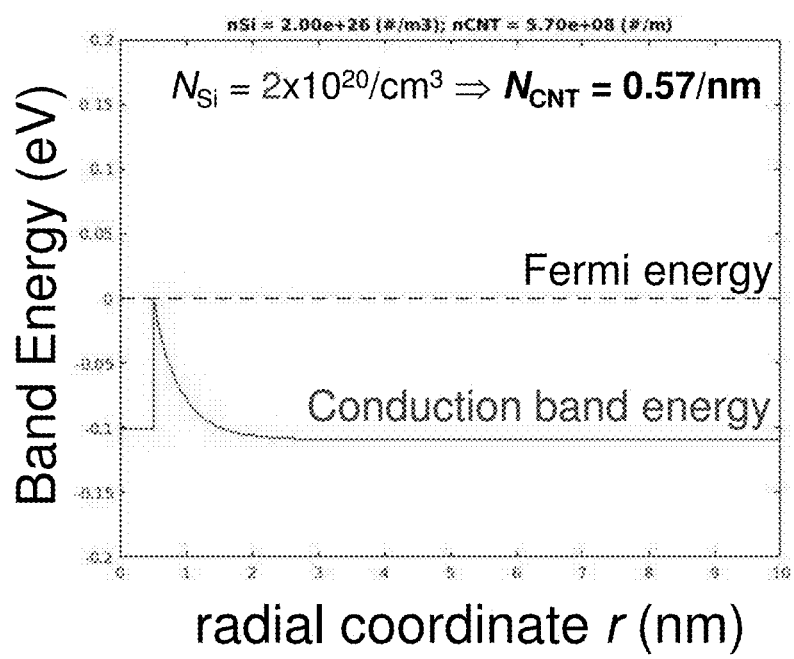
Figure 33D:
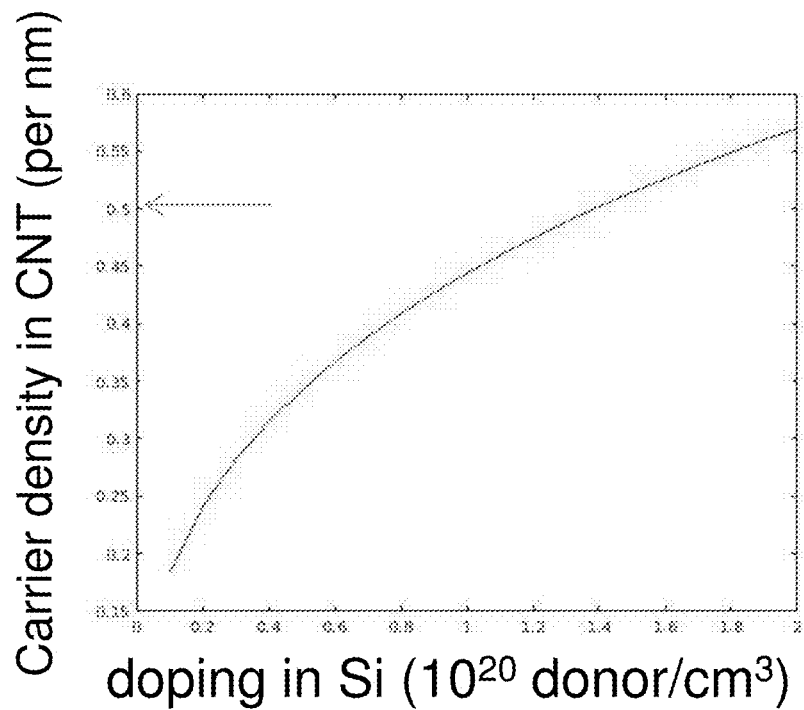

FIG. 33A shows a simulation model of a source/drain region of a CNT FET. The simulated CNT has a diameter of 1 nm and has a band gap about 0.8 eV, and is embedded in n$^+$-doped Si. A conduction band offset between Si and CNT is assumed 0.1 eV. FIGS. 33B and 33C show conduction band energy with respect to the distance r from the center of the CNT. FIG. 33B is the case where a doping concentration in Si is $1 \times 10^{20}$ atoms/cm$^3$ and FIG. 33C is the case where a doping concentration in Si $2 \times 10^{20}$ atoms/cm$^3$. The carrier density in the CNT is 0.44 per nm in FIG. 33B and 0.57 per nm in FIG. 33C. Further, as shown in FIG. 33D, increasing of doping amount in Si increases carrier density in CNT. The simulated results show that the source/drain structure of a CNT FET according to the present embodiments induce sufficient carriers in the CNT.

It will be understood that not all advantages have been necessarily discussed herein, no particular advantage is required for all embodiments or examples, and other embodiments or examples may offer different advantages. For example, in the present disclosure, because stacked structures of CNTs are formed as fin structures, it is possible to increase CNT density within one GAA FET. Further, by utilizing the doped semiconductor layer (e.g., $n^+$-Si) in the source/drain regions of the CNT, it is possible to increase movable carriers in the source/drain regions and to reduce contact resistance in the source/drain regions.

In accordance with an aspect of the present disclosure, in a method of forming a gate-all-around field effect transistor (GAA FET), a fin structure including CNTs embedded in a semiconductor layer is formed, a sacrificial gate structure is formed over the fin structure, the semiconductor layer is doped at a source/drain region of the fin structure, an interlayer dielectric (ILD) layer is formed, a source/drain opening is formed by patterning the ILD layer, and a source/drain contact layer is formed over the doped source/drain region of the fin structure. In one or more of the foregoing and following embodiments, the semiconductor layer is crystalline silicon. In one or more of the foregoing and following embodiments, an impurity concentration in the semiconductor layer after the doping is in a range from $1\times10^{20}$ atoms/cm$^3$ to $1\times10^{21}$ atoms/cm$^3$. In one or more of the foregoing and following embodiments, the semiconductor layer is doped by ion implantation. In one or more of the foregoing and following embodiments, doping the semiconductor layer is includes forming a doping layer containing impurities over the source/drain region, and driving the impurities into the source/drain region by a thermal operation. In one or more of the foregoing and following embodiments, the semiconductor layer is poly crystalline or amorphous. In one or more of the foregoing and following embodiments, the fin structure is formed by: (i) disposing a group of CNTs over a substrate, (ii) forming an epitaxial semiconductor layer to cover the CNTs, (iii) repeating (i) and (ii) for 2 to 10 times to form a stacked structure, and (iv) patterning the stacked structure by one or more lithography and etching operations. In one or more of the foregoing and following embodiments, the epitaxial semiconductor layer is made of a same material as the substrate. In one or more of the foregoing and following embodiments, a thickness of the epitaxial semiconductor layer is in a range from 5 nm to 15 nm. In one or more of the foregoing and following embodiments, in forming the source/drain opening, 20% to 80% of a height of the fin structure is exposed in the source/drain opening.

In accordance with another aspect of the present disclosure, in a method of forming GAA FET, a fin structure, in which carbon nanotubes (CNTs) are embedded in a support material, is formed over a substrate, a sacrificial gate structure is formed over the fin structure, an insulating layer is formed over the sacrificial gate structure and the fin structure, the sacrificial gate structure is removed so that a part of the fin structure is exposed, the support material is removed from the exposed part of the fin structure so that channel regions of CNTs are exposed, a gate structure is formed around the exposed channel regions of CNTs, a source/drain opening is formed in the insulating layer, the support material in the source/drain opening is removed so that source/drain regions of the CNTs are exposed, a semiconductor layer is formed around the exposed CNTs in the source/drain opening, and a source/drain contact layer is formed over the semiconductor layer. In one or more of the foregoing and following embodiments, after the source/drain opening is formed, a part of the substrate is exposed in the source/drain opening. In one or more of the foregoing and following embodiments, the semiconductor layer is crystalline silicon epitaxially formed on the exposed substrate. In one or more of the foregoing and following embodiments, after the source/drain opening is formed, a dielectric layer is disposed between the substrate and a bottom of the source/drain opening so that the substrate is not exposed. In one or more of the foregoing and following embodiments, the semiconductor layer is poly crystalline or amorphous. In one or more of the foregoing and following embodiments, an impurity concentration in the semiconductor layer is in a range from $2\times10^{20}$ atoms/cm$^3$ to $5\times10^{20}$ atoms/cm$^3$.

In accordance with another aspect of the present disclosure, in a method of forming a field effect transistor, a carbon nanotube (CNT) is disposed on a support layer, a sacrificial gate structure is formed over the CNT, an insulating layer is formed over the sacrificial gate structure and the CNT, the sacrificial gate structure is replaced with a metal gate structure, a source/drain opening is formed in the insulating layer, a semiconductor layer is formed around the exposed CNTs in the source/drain opening, and a source/drain contact layer is formed over the semiconductor layer. In one or more of the foregoing and following embodiments, after the source/drain opening is formed, a part of the substrate is exposed in the source/drain opening. In one or more of the foregoing and following embodiments, the semiconductor layer is crystalline silicon epitaxially formed on the exposed substrate. In one or more of the foregoing and following embodiments, after the source/drain opening is formed, a dielectric layer is disposed between the substrate and a bottom of the source/drain opening so that the substrate is not exposed.

In accordance with one aspect of the present disclosure, a semiconductor device having a GAA FET includes carbon nanotubes (CNTs) disposed over a substrate, a gate structure formed around each of the CNTs in a channel region, a doped semiconductor layer wrapping around each of the CNTs in a source/drain region, and a source/drain contact formed over the semiconductor layer. In one or more of the foregoing and following embodiments, the doped semiconductor layer is crystalline silicon doped with impurities. In one or more of the foregoing and following embodiments, an impurity concentration in the doped semiconductor layer is in a range from $1\times10^{20}$ atoms/cm$^3$ to $1\times10^{21}$ atoms/cm$^3$. In one or more of the foregoing and following embodiments, the GAA FET is an n-type FET and the doped semiconductor layer contains at least one of P and As as impurities. In one or more of the foregoing and following embodiments, the GAA FET is a p-type FET and the doped semiconductor layer contains at least one of B and Ga as impurities. In one or more of the foregoing and following embodiments, a semiconductor layer having a lower impurity concentration than the doped semiconductor layer is disposed between the doped semiconductor layer and the gate structure. In one or more of the foregoing and following embodiments, the CNTs include multiple groups of CNTs, the CNTs in a same group are located at a same height, and the multiple groups are located at different heights from each other. In one or more of the foregoing and following embodiments, one group is separated from an adjacent group by a distance in a range from 5 nm to 15 nm. In one or more of the foregoing and following embodiments, the doped semiconductor layer and the substrate are made of one of Si and SiGe. In one or more of the foregoing and following embodiments, ends of the CNTs are covered by a dielectric material.

In accordance with another aspect of the present disclosure, a semiconductor device having a field effect transistor includes an isolation insulating layer disposed over a substrate, carbon nanotubes (CNTs) disposed over the substrate, a gate structure formed around each of the CNTs in a channel region, a doped semiconductor layer wrapping around each of the CNTs in a source/drain region, and a source/drain contact formed over the semiconductor layer. The doped semiconductor layer is in contact with the isolation insulating layer. In one or more of the foregoing and following embodiments, the doped semiconductor layer passes through the isolation insulating layer and is in contact with the substrate. In one or more of the foregoing and following embodiments, the doped semiconductor layer is not in contact with the substrate. In one or more of the foregoing and following embodiments, the gate structure includes a gate dielectric layer wrapping around each of the CNTs, a work function adjustment layer formed on the gate dielectric layer and a gate electrode layer formed on the work function adjustment layer. In one or more of the foregoing and following embodiments, the work function adjustment layer partially wraps around the CNTs with the gate dielectric layer. In one or more of the foregoing and following embodiments, the work function adjustment layer fully wraps around each of the CNTs with the gate dielectric layer. In one or more of the foregoing and following embodiments, the gate dielectric layer includes one selected from the group consisting of $HfO_2$ and $Al_2O_3$. In one or more of the foregoing and following embodiments, the work function adjustment layer includes TiN. In one or more of the foregoing and following embodiments, the doped semiconductor layer is made of SiGe.

In accordance with another aspect of the present disclosure, a semiconductor device having a GAA FET includes a first GAA FET, and a second GAA FET. Each of the first GAA FET and the second GAA FET includes carbon nanotubes (CNTs) disposed over a substrate, and a gate structure formed around the CNTs in a channel region. The CNTs are shared by the first GAA FET and the second GAA FET, and source/drain regions of the CNTs are wrapped around by a doped silicon layer.

The entire disclosure of U.S. patent application Ser. No. 16/120,158 are incorporated herein by reference.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate-all-around field effect transistor (GAA FET), the method comprising:
    forming a fin structure including carbon nanotubes (CNTs) embedded in a semiconductor layer;
    forming a sacrificial gate structure over the fin structure;
    forming a doped source/drain region by doping the semiconductor layer at a source/drain region of the fin structure;
    forming an interlayer dielectric (ILD) layer over the doped source/drain region and the sacrificial gate structure;
    forming a source/drain opening by patterning the ILD layer; and
    forming a source/drain contact layer over the doped source/drain region of the fin structure.

2. The method of claim 1, wherein the semiconductor layer is crystalline silicon.

3. The method of claim 1, wherein an impurity concentration in the semiconductor layer after the doping is in a range from $1\times10^{20}$ atoms/cm$^3$ to about $1\times10^{21}$ atoms/cm$^3$.

4. The method of claim 1, wherein the semiconductor layer is doped by ion implantation.

5. The method of claim 1, wherein the doping the semiconductor layer comprises:
    forming a doping layer containing impurities over the source/drain region; and
    driving the impurities into the source/drain region by a thermal operation.

6. The method of claim 1, wherein the semiconductor layer is poly crystalline or amorphous.

7. The method of claim 1, wherein the fin structure is formed by:
    (i) disposing a group of CNTs over a substrate;
    (ii) forming an epitaxial semiconductor layer to cover the CNTs;
    (iii) repeating (i) and (ii) for 2 to 10 times to form a stacked structure; and
    (iv) patterning the stacked structure by one or more lithography and etching operations.

8. The method of claim 7, wherein the epitaxial semiconductor layer is made of a same material as the substrate.

9. The method of claim 7, wherein a thickness of the epitaxial semiconductor layer is in a range from 5 nm to 15 nm.

10. The method of claim 1, wherein in forming the source/drain opening, 20% to 80% of a height of the fin structure is exposed in the source/drain opening.

11. A method of forming a gate-all-around field effect transistor (GAA FET), the method comprising:
    forming a fin structure, in which carbon nanotubes (CNTs) are embedded in a support material, over a substrate;
    forming a sacrificial gate structure over the fin structure;
    forming an insulating layer over the sacrificial gate structure and the fin structure;
    removing the sacrificial gate structure so that a part of the fin structure is exposed to form an exposed part of the fin structure;
    removing the support material from the exposed part of the fin structure so that channel regions of CNTs are exposed to form exposed channel regions of CNTs;
    forming a gate structure around the exposed channel regions of CNTs;
    forming a source/drain opening in the insulating layer;
    removing the support material in the source/drain opening so that source/drain regions of the CNTs are exposed to form exposed CNTs;
    forming a semiconductor layer around the exposed CNTs in the source/drain opening; and
    forming a source/drain contact layer over the semiconductor layer.

12. The method of claim 11, wherein after the source/drain opening is formed, a part of the substrate is exposed in the source/drain opening.

13. The method of claim 12, wherein the semiconductor layer is crystalline silicon epitaxially formed on the exposed substrate.

14. The method of claim 11, wherein after the source/drain opening is formed, a dielectric layer is disposed between the substrate and a bottom of the source/drain opening so that the substrate is not exposed.

15. The method of claim 14, wherein the semiconductor layer is poly crystalline or amorphous.

16. The method of claim 11, wherein an impurity concentration in the semiconductor layer is in a range from $2 \times 10^{20}$ atoms/cm$^3$ to about $5 \times 10^{20}$ atoms/cm$^3$.

17. A method of forming a field effect transistor, the method comprising:
　disposing a carbon nanotube (CNT) on a support layer disposed over a substrate;
　forming a sacrificial gate structure over the CNT;
　forming an insulating layer over the sacrificial gate structure and the CNT;
　replacing the sacrificial gate structure with a metal gate structure;
　forming exposed CNTs by forming a source/drain opening in the insulating layer;
　forming a semiconductor layer around the exposed CNTs in the source/drain opening; and
　forming a source/drain contact layer over the semiconductor layer.

18. The method of claim 17, wherein after the source/drain opening is formed, a part of the substrate is exposed in the source/drain opening.

19. The method of claim 18, wherein the semiconductor layer is crystalline silicon epitaxially formed on the part of the substrate.

20. The method of claim 18, wherein after the source/drain opening is formed, an insulating layer is disposed between the substrate and a bottom of the source/drain opening so that the substrate is not exposed.

* * * * *